(12) United States Patent
Tanaka

(10) Patent No.: US 7,007,257 B2
(45) Date of Patent: Feb. 28, 2006

(54) AUTOMATIC PLACEMENT AND ROUTING APPARATUS FOR DESIGNING INTEGRATED CIRCUIT THAT CONTROLS ITS TIMING USING MULTIPLE POWER SUPPLIES

(75) Inventor: Genichi Tanaka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 327 days.

(21) Appl. No.: 10/301,739

(22) Filed: Nov. 22, 2002

(65) Prior Publication Data

US 2003/0221175 A1 Nov. 27, 2003

(30) Foreign Application Priority Data

May 22, 2002 (JP) .............................. 2002-148151

(51) Int. Cl.
*G06F 17/50* (2006.01)
*G06F 9/45* (2006.01)
(52) U.S. Cl. .................... 716/9; 716/6; 716/12; 716/13
(58) Field of Classification Search .................... 716/7, 716/6, 12, 13, 1, 4, 9; 326/20–38
See application file for complete search history.

(56) References Cited

U.S. PATENT DOCUMENTS

| 6,225,858 | B1 * | 5/2001 | Guardiani et al. .......... 327/544 |
| 6,266,798 | B1 * | 7/2001 | Kanazawa et al. ............. 716/4 |
| 6,370,678 | B1 * | 4/2002 | Culler ........................ 716/18 |
| 6,490,715 | B1 * | 12/2002 | Moriwaki et al. ............ 716/17 |
| 6,598,206 | B1 * | 7/2003 | Darden et al. ................. 716/2 |
| 6,675,139 | B1 * | 1/2004 | Jetton et al. ................. 703/17 |
| 6,792,582 | B1 * | 9/2004 | Cohn et al. .................... 716/7 |
| 6,820,240 | B1 * | 11/2004 | Bednar et al. ................. 716/1 |
| 2002/0002700 | A1 * | 1/2002 | Inui et al. ..................... 716/8 |
| 2002/0124234 | A1 * | 9/2002 | Linz ........................... 716/18 |
| 2003/0018949 | A1 * | 1/2003 | Yoshida ....................... 716/14 |
| 2003/0177459 | A1 * | 9/2003 | Chen ............................ 716/5 |
| 2004/0243958 | A1 * | 12/2004 | Bednar et al. ................. 716/7 |

FOREIGN PATENT DOCUMENTS

| JP | 1-200647 | 8/1989 |
| JP | 4-96369 | 3/1992 |
| JP | 5-299624 | 11/1993 |
| JP | 6-260557 | 9/1994 |

* cited by examiner

*Primary Examiner*—Vuthe Siek
*Assistant Examiner*—Magid Y. Dimyan
(74) *Attorney, Agent, or Firm*—Buchanan Ingersoll PC

(57) ABSTRACT

An automatic placement and routing apparatus includes an initial power supply setting section for setting initial power supply potentials of cells; a placement and routing section for performing placement, global routing and detail routing of the cells according to a netlist and timing constraint information; a timing verification section for performing the timing verification of the specified paths according to the layout information at a particular stage of the placement and routing; and a power supply modification section for changing, when a cell having a timing problem is detected, the power supply potential of the cell. When the cell having a timing problem is detected, the placement and routing section optimizes the layout according to the change of the power supply potential of the cell, and the timing verification section performs the timing verification of the specified paths according to the layout information optimized.

16 Claims, 15 Drawing Sheets

AUTOMATIC PLACEMENT AND ROUTING APPARATUS FOR DESIGNING INTEGRATED CIRCUIT THAT CONTROLS ITS TIMING USING MULTIPLE POWER SUPPLIES

BACKGROUND OF THE INVENTION

1. Field of the Invention

The present invention relates to an automatic placement and routing apparatus used for designing a semiconductor integrated circuit including a plurality of power supply systems with different potentials.

2. Description of Related Art

A conventional automatic placement and routing apparatus and an automatic placement and routing method control the timing of a semiconductor integrated circuit by placement improvement that alters the cell placement, by routing improvement that alters the wiring length, width and spacing, and by logic improvement that alters the logic circuit.

FIG. 17 is a block diagram showing a configuration of a conventional automatic placement and routing apparatus. In FIG. 17, the reference numeral 101 designates an automatic placement and routing apparatus; 102 designates a cell library for storing cells; 103 designates a netlist describing logic connection information about the semiconductor integrated circuit; 104 designates timing constraint information about the semiconductor integrated circuit; 105 designates a layout design section for making a layout design of the semiconductor integrated circuit in accordance with the netlist 103 and timing constraint information 104 using the cells stored in the cell library 102; 106 designates an input section for a user of the automatic placement and routing apparatus 101 to input information needed for the layout design by the layout design section 105; and 107 designates a display section for displaying a layout design state in a specified layout design stage by the layout design section 105.

In the layout design section 105, the reference numeral 108 designates a link section for linking the netlist 103 with the cells stored in the cell library 102; 109 designates a placement and routing section for carrying out the placement, global routing and detail routing of the cells stored in the cell library 102 according to the netlist 103 and timing constraint information 104; 110 designates a timing verification section for carrying out the timing verification of specified paths according to the layout information after the placement and routing by the placement and routing section 109; and 111 designates a timing improvement section including a placement alteration section 112, a routing alteration section 113 and a logic alteration section 114. The placement alteration section 112 alters, when the timing verification detects a cell having a timing problem, the placement of the cell and its neighboring cells. The routing alteration section 113 alters the neighboring routing of the cell, and the logic alteration section 114 alters the neighboring logic circuit of the cell.

The placement and routing section 109 carries out, when the timing verification detects a cell having a timing problem, the replacement and rerouting of the altered portion in accordance with the alteration of the cell placement specified by the placement alteration section 112, the alteration of the routing specified by the routing alteration section 113 and the alteration of the logic circuit specified by the logic alteration section 114, thereby optimizing the layout. When the timing verification detects no cells having a timing problem, the placement and routing section 109 outputs layout information 115 and a netlist 116.

Next, the operation of the conventional automatic placement and routing apparatus will be described.

FIG. 18 is a flowchart illustrating the operation of the conventional automatic placement and routing method.

First, the link section 108 reads the netlist 103 that contains the logic connection information about the semiconductor integrated circuit, and links the netlist 103 to the cells stored in the cell library 102 (step ST201).

Subsequently, reading the netlist 103 linked to the cells stored in the cell library 102 and the timing constraint information 104 about the semiconductor integrated circuit, the placement and routing section 109 carries out the placement, global routing and detail routing of the cells stored in the cell library 102 in accordance with the netlist 103 and the timing constraint information 104 which are read out (step ST202).

Subsequently, the timing verification section 110 reads the layout information after the placement and routing by the placement and routing section 109, and carries out the timing verification of the specified paths in accordance with the layout information (step ST203).

Subsequently, when the timing verification detects a cell having a timing problem at step ST204, the placement alteration section 112 decides to alter the placement of the cell and its neighboring cells. In addition, the routing alteration section 113 decides to alter the routing of the cell and its neighboring cells, and the logic alteration section 114 decides to alter the logic circuit of the cell and its neighboring cells (step ST205).

Subsequently, the placement and routing section 109 reads information about the alterations of the cell placement determined by the placement alteration section 112, of the routing determined by the routing alteration section 113 and of the logic circuit determined by the logic alteration section 114 to carry out the replacement and rerouting of the altered portion in accordance with these altered items of information, thereby optimizing the layout (step ST206).

Subsequently, the timing verification section 110 reads the optimized layout information, and carries out the timing verification of the specified paths in accordance with the layout information (step ST203).

When the timing verification detects no cells having a timing problem at step ST204, the placement and routing section 109 outputs the layout information 115 and netlist 116 (step ST207).

The procedure from step ST203 to step ST206 is carried out until the timing verification detects no cell having the timing problem at step ST204, that is, until the timing constraint is satisfied.

FIG. 19 is a layout diagram of the semiconductor integrated circuit completed by the conventional automatic placement and routing apparatus and automatic placement and routing method. FIG. 20 is a circuit diagram of the circuit formed in accordance with the layout of FIG. 19. In these figures, reference numerals 121–124 designate first to fourth cells. The first to fourth cells 121–124 each denote an inverter comprising intra-cell mains at its top and bottom sides. The reference numeral 125 designates a first power supply main including an upper intra-cell main of the first cell 121 and an upper intra-cell main of the second cell 122 as its part; and 126 designates a second power supply main including a lower intra-cell main of the third cell 123 and a lower intra-cell main of the fourth cell 124 as its part. The first power supply main 125 and the second power supply main 126 have the same potential. The reference numeral 127 designates a ground main including as its part the lower intra-cell main of the first cell 121, the lower intra-cell main of the second cell 122, the upper intra-cell main of the third cell 123 and the upper intra-cell main of the fourth cell 124.

The first and second cells 121 and 122 are disposed in such a manner that the upper intra-cell main of the first cell 121 is connected with that of the second cell 122, and the lower intra-cell main of the first cell 121 is connected with that of the second cell 122. In addition, the third and fourth cells 123 and 124 are disposed in such a manner that the upper intra-cell main of the third cell 123 is connected with that of the fourth cell 124, and the lower intra-cell main of the third cell 123 is connected with that of the fourth cell 124. Furthermore, the first and second cells 121 and 122, and the third and fourth cells 123 and 124 are placed in such a manner that the lower intra-cell mains of the first and second cells 121 and 122 overlap the upper intra-cell mains of the third and fourth cells 123 and 124.

In each of the first to fourth cells 121–124, the reference numeral 128 designates a gate electrode of a PMOS transistor; 129 designates a gate electrode of an NMOS transistor; 130 designates an active region of the PMOS transistor; 131 designates an active region of the NMOS transistor; 132 designates a first metal interconnection connected to the source region of the PMOS transistor; 133 designates a second metal interconnection connected to the source region of the NMOS transistor; 134 designates a third metal interconnection for connecting the gate electrode 128 of the PMOS transistor with the gate electrode 129 of the NMOS transistor, which gate electrodes function as an input terminal; and 135 designates a fourth metal interconnection for connecting the drain region of the PMOS transistor with that of the NMOS transistor, which drain regions function as an output terminal.

The reference numeral 136 designates a first signal line connected to the third metal interconnection 134 serving as the input terminal of the first cell 121; 137 designates a second signal line connected to the fourth metal interconnection 135 serving as the output terminal of the first cell 121 and to the third metal interconnection 134 serving as the input terminal of the third cell 123; 138 designates a third signal line connected to the fourth metal interconnection 135 serving as the output terminal of the third cell 123; 139 designates a fourth signal line connected to the third metal interconnection 134 serving as the input terminal of the second cell 122; 140 designates a fifth signal line connected to the fourth metal interconnection 135 serving as the output terminal of the second cell 122, and to the third metal interconnection 134 serving as the input terminal of the fourth cell 124; and 141 designates a sixth signal line connected to the fourth metal interconnection 135 serving as the output terminal of the fourth cell 124.

The first metal interconnections 132 of the first and second cells 121 and 122 are connected to the first power supply main 125, and the first metal interconnections 132 of the third and fourth cells 123 and 124 are connected to the second power supply main 126. In addition, the second metal interconnections 133 of the first to fourth cells 121–124 are connected to the ground main 127.

In the conventional system, the power supply potentials of the individual cells are determined in advance. For example, the individual cells are connected to the nearest power supply mains as shown in FIG. 19. Thus, the power supply potentials of the individual cells are equal to the potentials of the nearest power supply mains.

With the foregoing configuration, the conventional automatic placement and routing apparatus and automatic placement and routing method control the timing of the semiconductor integrated circuit by altering the cell placement, routing and logic. Accordingly, meeting the timing constraint is likely to be time consuming.

SUMMARY OF THE INVENTION

The present invention is implemented to solve the foregoing problem. It is therefore an object of the present invention to provide an automatic placement and routing apparatus capable of controlling the timing of the semiconductor integrated circuit by varying the power supply potential of the cells.

According to one aspect of the present invention, there is provided an automatic placement and routing apparatus including a link section for linking a netlist to cells stored in a cell library; a placement and routing section for carrying out placement, global routing and detail routing of the cells stored in the cell library according to the netlist and timing constraint information; a timing verification section for carrying out timing verification of specified paths according to layout information about the placement and routing by the placement and routing section; and a power supply modification section for specifying, when the timing verification detects a cell having a timing problem, change of the power supply potential of the cell, wherein when the timing verification detects the cell having a timing problem, the placement and routing section optimizes the layout according to the change of the power supply potential of the cell, and the timing verification section carries out the timing verification of the specified paths according to the optimized layout information. Thus, it offers an advantage of being able to facilitate the timing control of the semiconductor integrated circuit because it can vary the timing by changing the power supply potential of the cell.

DETAILED DESCRIPTION OF THE PREFERRED EMBODIMENTS

The invention will now be described with reference to the accompanying drawings.

Embodiment 1

Figure 1:
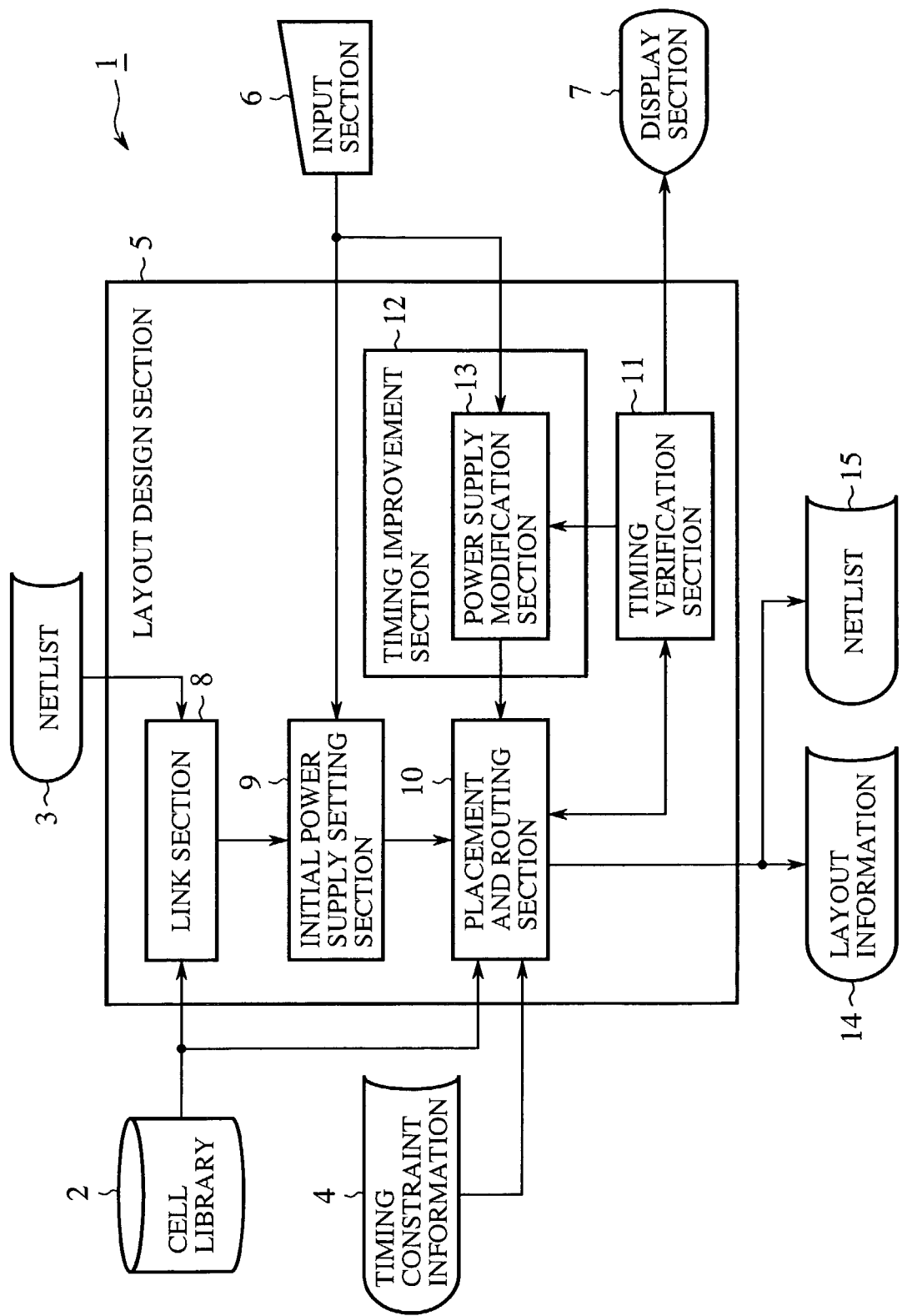
FIG. 1 is a block diagram showing a configuration of an automatic placement and routing apparatus of an embodiment 1 in accordance with the present invention.

FIG. 1 is a block diagram showing a configuration of the automatic placement and routing apparatus of an embodiment 1 in accordance with the present invention. In FIG. 1, the reference numeral 1 designates an automatic placement and routing apparatus which is used for the layout design of a semiconductor integrated circuit comprising a plurality of power supply systems with different potentials. The reference numeral 2 designates a cell library for storing cells; 3 designates a netlist describing logic connection information about the semiconductor integrated circuit; and 4 designates timing constraint information about the semiconductor integrated circuit. The reference numeral 5 designates a layout design section for making a layout design of the semiconductor integrated circuit in conformity with the netlist 3 and timing constraint information 4 using the cells stored in the cell library 2. The reference numeral 6 designates an input section such as a keyboard for a user of the automatic placement and routing apparatus 1 to input information needed by the layout design section 5 for the layout design; and 7 designates a display section such as a CRT and LCD for displaying layout design state in a specified layout design stage by the layout design section 5.

In the layout design section 5, the reference numeral 8 designates a link section for linking the netlist 3 with the cells stored in the cell library 2. The link section 8 specifies, for example, which inverter with the layout information stored in the cell library 2 corresponds to an inverter described in the netlist 3. The reference numeral 9 designates an initial power supply setting section for setting the initial power supply potentials of the cells linked with the netlist 3. In the present embodiment 1, the initial power supply potentials of all the cells are set at the same power supply potential. For example, they are set at the lowest power supply potential.

The reference numeral 10 designates a placement and routing section for carrying out the placement, global routing and detail routing of the cells stored in the cell library 2 according to the netlist 3 and timing constraint information 4. The placement and routing section 10 designs the layout of the semiconductor integrated circuit by carrying out the placement of functional blocks such as a ROM, the placement of the cells in the functional blocks, the global routing that divides a routing region into a plurality of subdivisions and assigns routing to the subdivisions, and the detail routing that decides final positions of the routing in the subdivisions. The reference numeral 11 designates a timing verification section for carrying out the timing verification of specified paths according to the layout information after the placement and routing by the placement and routing section 10. The timing verification section 11 checks the timings on the paths across a sequential circuit, paths across input/output ports and paths between the sequential circuit and the input/output ports, for example.

The reference numeral 12 designates a timing improvement section comprising a power supply modification section 13 for deciding, when the timing verification detects a cell having a timing problem, the change of the power supply potential of the cells. The following are examples of the cell having a timing problem: a first type cell with a long delay time in a path because of a lot of cells constituting the cell, in which the delay times of the individual cells must be reduced; a second type cell with a long delay time in a path, through which data must be transferred at a high rate to synchronize with the clock; and a third type cell with a short delay time in a path, through which data must be transferred at a low rate to synchronize with the clock. The power supply modification section 13 specifies the change of the power supply potential of the cells such that the power supply potential of the cell is increased in the first type cell and the second type cell in which the delay time must be reduce, and that the power supply potential of the cell is reduced in the third type cell in which the delay time must be increased. In the present embodiment 1, since the initial power supply setting section 9 sets the initial values of all the power supply potential of the cells at the lowest power supply potential, the power supply modification section 13 can only specify the change of the power supply potential of the cells such that it increases only the power supply potential of the cells whose delay time must be reduced, when the timing verification detects a cell having a timing problem.

The placement and routing section 10 carries out, when the timing verification detects a cell having a timing problem, replacement and rerouting of the altered portion in accordance with the change of the power supply potential of the cells specified by the power supply modification section 13, thereby optimizing the layout. When the timing verification detects no cells having a timing problem, the placement and routing section 10 outputs layout information 14 and a netlist 15. The output layout information 14 is used for forming a mask, and the output netlist 15 is used for various types of verification.

Next, the operation of the present embodiment 1 will be described.

Figure 2:
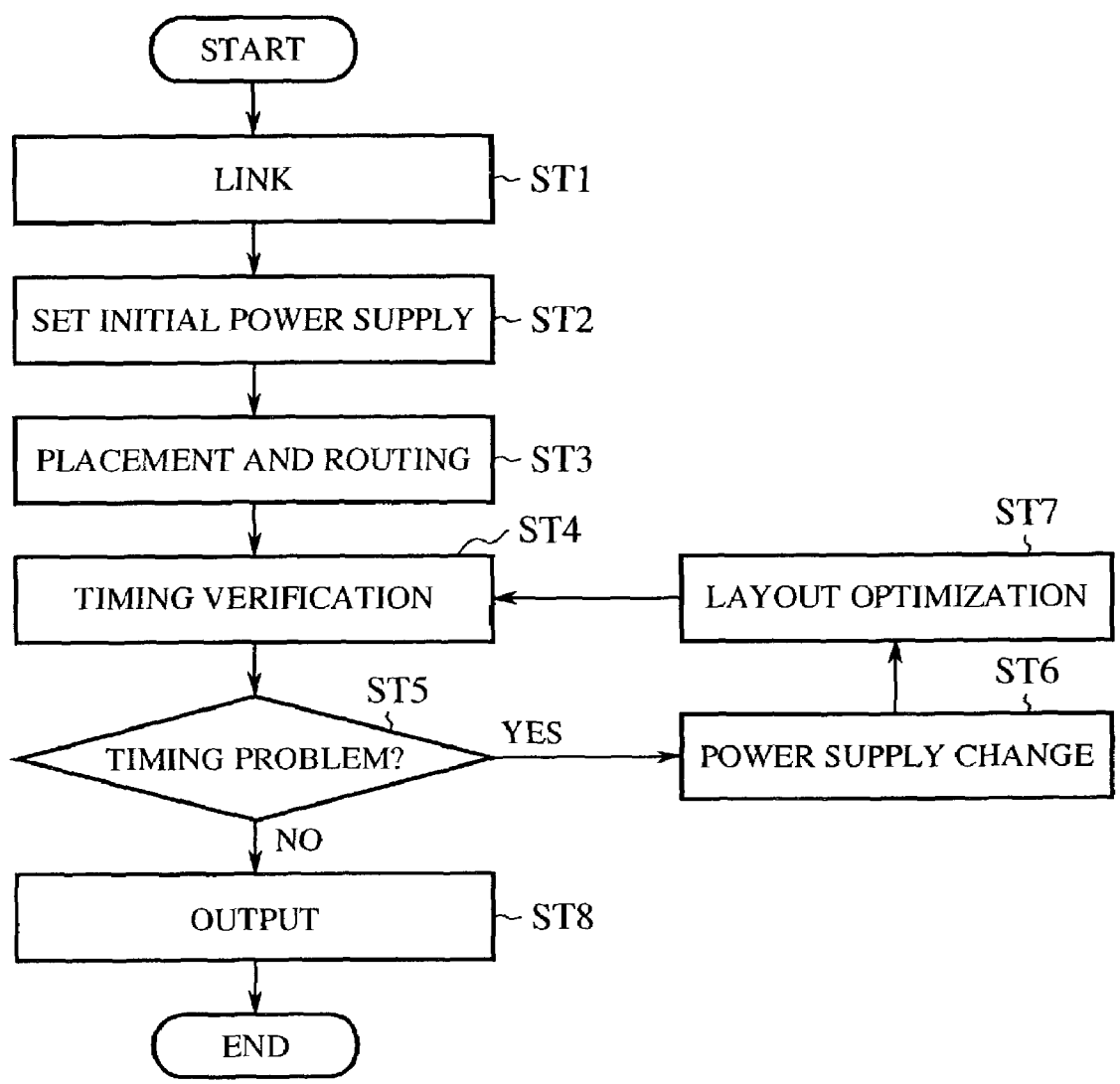
FIG. 2 is a flowchart illustrating a procedure of an automatic placement and routing method of the embodiment 1 in accordance with the present invention.

FIG. 2 is a flowchart illustrating a procedure of the automatic placement and routing method of the embodiment 1 in accordance with the present invention.

First, the link section 8 reads the netlist 3 that contains the logic connection information about the semiconductor integrated circuit, and links the netlist 3 to the cells stored in the cell library 2 (step ST1).

Subsequently, reading the netlist 3 linked to the cells stored in the cell library 2, the initial power supply setting section 9 sets the initial power supply potentials of all the cells linked with the read netlist 3 at the lowest power supply potential (step ST2).

Subsequently, the placement and routing section 10 reads the netlist 3 linked to the cells stored in the cell library 2, the initial power supply potentials of the cells linked with the netlist 3 and the timing constraint information 4 about the semiconductor integrated circuit, and carries out the placement, global routing and detail routing of the cells stored in the cell library 2 in accordance with the read netlist 3 and the timing constraint information 4 (step ST3).

Subsequently, the timing verification section 11 reads the layout information after the placement and routing by the placement and routing section 10, and carries out the timing verification of the specified paths in accordance with the layout information (step ST4).

Subsequently, when the timing verification detects a cell having a timing problem at step ST5, the power supply modification section 13 specifies the change of the power supply potential of the cell whose delay time must be reduced such that the power supply potential is increased (step ST6).

Subsequently, the placement and routing section 10 reads the information about the change of the power supply potential of the cells specified by the power supply modification section 13, and carries out the replacement and rerouting of the altered portion in accordance with the information about the change of the power supply potential, thereby optimizing the layout (step ST7).

Subsequently, the timing verification section 11 reads the optimized layout information, and carries out the timing verification of the specified paths in accordance with the layout information (step ST4).

When the timing verification detects no cells having a timing problem at step ST5, the placement and routing section 10 outputs the layout information 14 and netlist 15 (step ST8).

The procedure from step ST4 to step ST7 is carried out until the timing verification detects no cell having a timing problem at step ST5, that is, until the timing constraint is satisfied.

Figure 3:
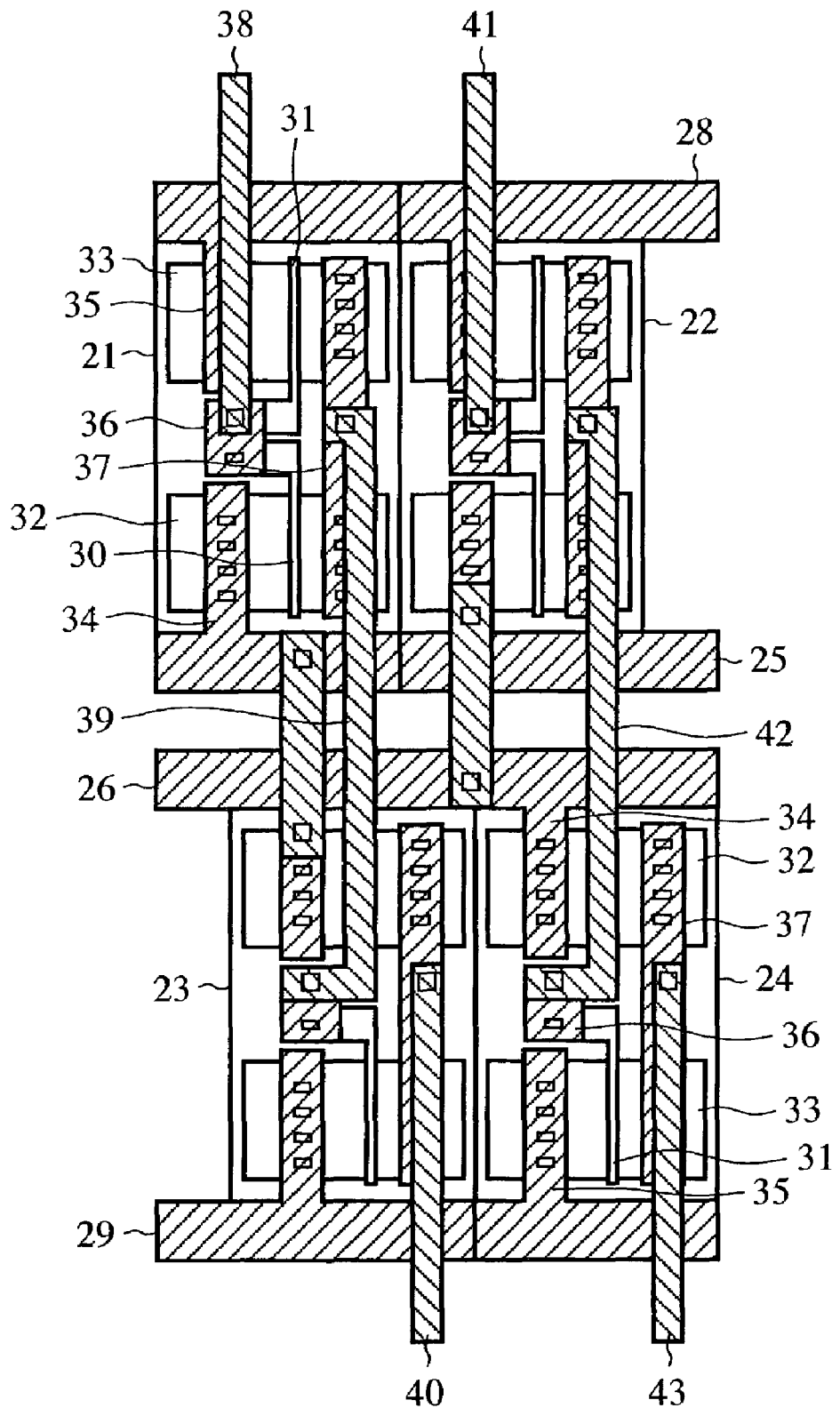
FIG. 3 is a layout diagram showing a layout of a semiconductor integrated circuit which includes two power supply systems, and is completed by the automatic placement and routing apparatus and automatic placement and routing method of the embodiment 1 in accordance with the present invention.
Figure 4:
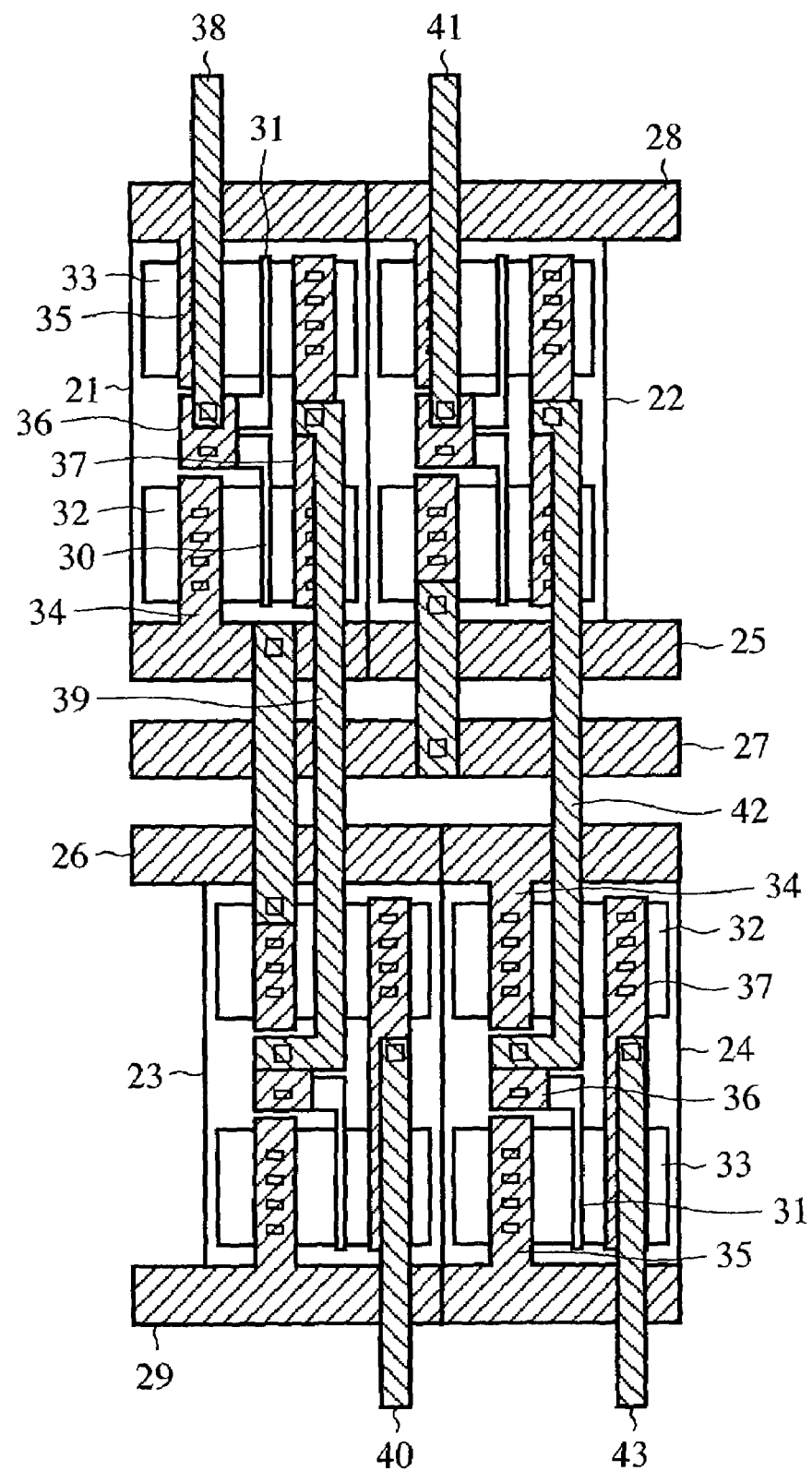
FIG. 4 is a layout diagram showing a layout of a semiconductor integrated circuit which includes three power supply systems, and is completed by the automatic placement and routing apparatus and automatic placement and routing method of the embodiment 1 in accordance with the present invention.
Figure 5:
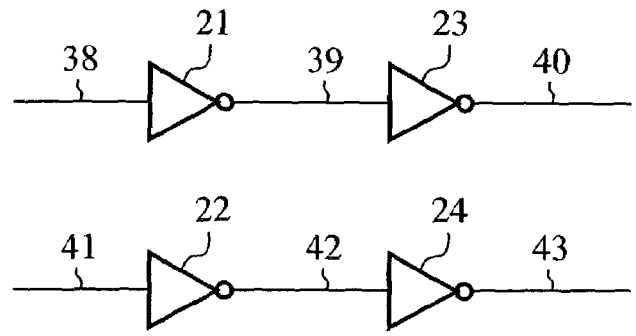
FIG. 5 is a diagram showing the circuits fabricated in conformity with the layouts of FIGS. 3 and 4.

FIGS. 3 and 4 are layout diagrams each showing a structure of the semiconductor integrated circuit completed by the automatic placement and routing apparatus and automatic placement and routing method of the present embodiment 1. FIG. 3 illustrates the case including two power supply systems; and FIG. 4 illustrates the case including three power supply systems. FIG. 5 is a circuit diagram of the circuits formed in conformity with the layouts of FIGS. 3 and 4. In these figures, reference numerals 21–24 designate first to fourth cells, respectively. The first to fourth cells 21–24 each denote an inverter comprising intra-cell mains at its top and bottom sides. The reference numeral 25 designates a first power supply main including a lower intra-cell main of the first cell 21 and a lower intra-cell main of the second cell 22 as its part; and 26 designates a second power supply main including an upper intra-cell main of the third cell 23 and an upper intra-cell main of the fourth cell 24 as its part. The first power supply main 25 has a higher potential than the second power supply main 26. The reference numeral 27 (FIG. 4) designates a third power supply main that includes none of the first to fourth cells 21–24 as its part. The third power supply main 27 has a potential lower than the first power supply main 25 and higher than the second power supply main 26. The reference numeral 28 designates a first ground main including as its part the upper intra-cell main of the first cell 21 and the upper intra-cell main of the second cell 22. The reference numeral 29 designates a second ground main including as its part the lower intra-cell main of the third cell 23 and the lower intra-cell main of the fourth cell 24. The first and second ground mains 28 and 29 may have the same potential or different potentials.

The first and second cells 21 and 22 are disposed in such a manner that the upper intra-cell main of the first cell 21 is connected with that of the second cell 22 and the lower intra-cell main of the first cell 21 is connected with that of the second cell 22. In addition, the third and fourth cells 23 and 24 are disposed in such a manner that the upper intra-cell main of the third cell 23 is connected with that of the fourth cell 24, and the lower intra-cell main of the third cell 23 is connected with that of the fourth cell 24. Furthermore, in FIG. 3, the first and second cells 21 and 22 and the third and fourth cells 23 and 24 a replaced in such a manner that the lower intra-cell mains of the first and second cells 21 and 22 are opposing to the upper intra-cell mains of the third and fourth cells 23 and 24. Moreover, in FIG. 4, the first and second cells 21 and 22 and the third and fourth cells 23 and 24 are placed in such a manner that the third power supply main 27 is interposed between the lower intra-cell mains of the first and second cells 21 and 22 and the upper intra-cell mains of the third and fourth cells 23 and 24.

In each of the first to fourth cells 21–24, the reference numeral 30 designates a gate electrode of a PMOS transistor; 31 designates a gate electrode of an NMOS transistor; 32 designates an active region of the PMOS transistor; 33 designates an active region of the NMOS transistor; 34 designates a first metal interconnection connected to the source region of the PMOS transistor; 35 designates a second metal interconnection connected to the source region of the NMOS transistor; 36 designates a third metal interconnection for connecting the gate electrode 30 of the PMOS transistor with the gate electrode 31 of the NMOS transistor, which gate electrodes function as an input terminal; and 37 designates a fourth metal interconnection for connecting the drain region of the PMOS transistor with the drain region of the NMOS transistor, which drain regions function as an output terminal.

The reference numeral 38 designates a first signal line connected to the third metal interconnection 36 serving as the input terminal of the first cell 21; 39 designates a second signal line connected to the fourth metal interconnection 37 serving as the output terminal of the first cell 21 and to the third metal interconnection 36 serving as the input terminal of the third cell 23; 40 designates a third signal line connected to the fourth metal interconnection 37 serving as the output terminal of the third cell 23; 41 designates a fourth signal line connected to the third metal interconnection 36 serving as the input terminal of the second cell 22; 42 designates a fifth signal line connected to the fourth metal interconnection 37 serving as the output terminal of the second cell 22, and to the third metal interconnection 36 serving as the input terminal of the fourth cell 24; and 43 designates a sixth signal line connected to the fourth metal interconnection 37 serving as the output terminal of the fourth cell 24.

The first metal interconnection 34 of the first cell 21 is connected to the first power supply main 25. The first metal interconnection 34 of the second cell 22 is connected to the second power supply main 26 in FIG. 3, and to the third power supply main 27 in FIG. 4. The first metal interconnection 34 of the third cell 23 is connected to the first power supply main 25. The first metal interconnection 34 of the fourth cell 24 is connected to the second power supply main 26. The second metal interconnections 35 of the first and second cells 21 and 22 are connected to the first ground main 28. The second metal interconnections 35 of the third and fourth cells 23 and 24 are connected to the second ground main 29.

Assume in FIGS. 3 and 4 that the path from the first signal line 38 to the third signal line 40 is a part of a path which includes a lot of cells, and hence the delay time of each cell must be reduced because of little allowable time, and that the path from the signal line 41 to the sixth signal line 43 is a part of a path which includes a small number of cells, and hence has no problem of increasing the delay time of each cell because of much allowable time. In other words, the path from the first signal line 38 to the third signal line 40 is a part of the path that must transmit data at a high rate to establish synchronization with the clock, whereas the path from the fourth signal line 41 to the sixth signal line 43 is a part of the path that must transmit the data at a low rate to establish synchronization with the clock.

In the present embodiment 1, the power supply potentials of the cells are decided in the layout design process of the semiconductor integrated circuit such that they satisfy the timing constraint of the semiconductor integrated circuit. In FIG. 3, the first and third cells 21 and 23 in the path with little timing allowance or the path that must transfer data at a high rate to establish synchronization with the clock is connected to the first power supply main 25. On the other hand, the second and fourth cells 22 and 24 in the path with enough timing allowance or the path that must transfer data at a low rate to establish synchronization with the clock are connected to the second power supply main 26. In FIG. 4, the first and third cells 21 and 23 in the path with little timing allowance or the path that must transfer data at a high rate to establish synchronization with the clock is connected to the first power supply main 25. On the other hand, the second cell 22 and the fourth cell 24 in the path with enough timing allowance or the path that must transfer data at a low rate to establish synchronization with the clock are connected to the third power supply main 27 and the second power supply main 26, respectively. As a result, the power supply potential of the first and third cells 21 and 23 is higher than that of the second and fourth cells 22 and 24. Accordingly, the first and third cells 21 and 23 operate at a higher speed than the second and fourth cells 22 and 24.

The structures of FIGS. 3 and 4 are provided only as an example. A semiconductor integrated circuit completed by the automatic placement and routing apparatus and method of the embodiment 1 in accordance with the present invention may have four or more power supply mains, or three or more ground mains. In addition, although each cell is connected to its nearest ground main in FIGS. 3 and 4, it can be connected to another ground main.

As described above, the present embodiment 1 enables the semiconductor integrated circuit to control its timing by changing the power supply potential of the cells, offering an advantage of being able to facilitate the timing control.

In addition, since the present embodiment 1 sets the initial power supply potentials of all the cells at the same power supply potential, it has an advantage of being able to facilitate the initial setting of the power supply potentials.

Furthermore, since the present embodiment 1 sets the initial power supply potentials of all the cells at the lowest power supply potential, it has an advantage of being able to facilitate the design of a low power consumption semiconductor integrated circuit.

Incidentally, although the present embodiment 1 carries out the initial setting of the power supply potentials before the placement and routing, this is not essential. For example, the initial setting can be performed during or after the placement and routing process.

In addition, although the present embodiment 1 carries out the timing verification after the placement and routing, it can be carried out during the placement and routing process.

Embodiment 2

In the present embodiment 2, the initial power supply setting section 9 sets the initial power supply potentials of all the cells at the highest power supply potential. When the timing verification detects a cell having a timing problem afterward, the power supply modification section 13 specifies the change of the power supply potential of the cell such that the power supply potential of the cell whose delay time must be increased is reduced.

As described above, since the present embodiment 2 sets the initial power supply potentials of all the cells at the highest power supply potential, it offers an advantage of being able to facilitate the design of a high-speed semiconductor integrated circuit.

Embodiment 3

In the present embodiment 3, when it comprises three or more power supply systems, the initial power supply setting section 9 sets the initial power supply potentials of all the cells at a power supply potential other than the lowest and highest power supply potentials. When the timing verification detects a cell having a timing problem afterward, the power supply modification section 13 specifies the change of the power supply potential of the cell such that the power supply potential of the cell whose delay time must be reduced is increased, and the power supply potential of the cell whose delay time must be increased is reduced.

As described above, the present embodiment 3 sets the initial power supply potentials of all the cells at an intermediate power supply potential. As a result, it offers an advantage of being able to facilitate the design of various types of semiconductor integrated circuits.

Embodiment 4

In the present embodiment 4, the initial power supply setting section 9 assigns a plurality of power supply potentials to the cells, and sets the initial power supply potentials of the cells at the assigned power supply potentials. Afterward, when the timing verification detects a cell having a timing problem, the power supply modification section 13 specifies the change of the power supply potential of the cell such that the power supply potential of the cell whose delay time must be reduced is increased, and the power supply potential of the cell whose delay times must be increased is reduced.

As described above, the present embodiment 4 assigns a plurality of power supply potentials to the cells, and sets the initial power supply potentials of the cells at the assigned power supply potentials. Thus, it can prevent a large voltage drop of a particular power supply, which may occur when the initial power supply potentials of all the cells are set at the same power supply potential. As a result, it offers an advantage of being able to facilitate the design of the power supplies.

In addition, when the individual power supply potentials are delivered to nearly the same number of cells, the voltage drop of each power supply becomes nearly equal. Thus, it offers an advantage of being able to design the individual power supplies under equal conditions.

Embodiment 5

Figure 6:
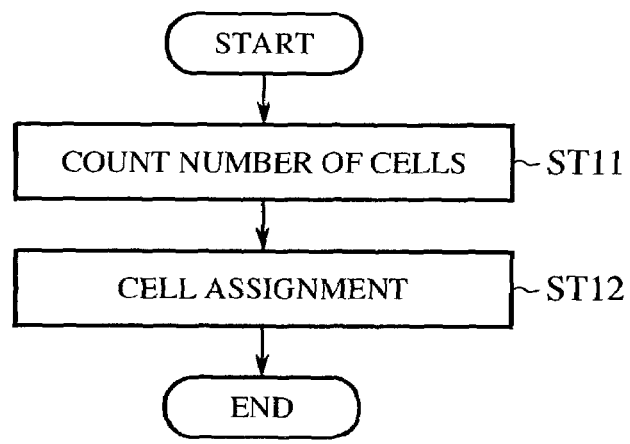
FIG. 6 is a flowchart illustrating an initial power supply setting method in the automatic placement and routing method of an embodiment 5 in accordance with the present invention.

FIG. 6 is a flowchart illustrating a procedure of the initial power supply setting method in the automatic placement and routing method of an embodiment 5 in accordance with the present invention.

In the embodiment 5, the initial power supply setting section 9 reads the netlist 3 linked to the cells stored in the cell library 2. Then, it counts the number of cells in each of the paths that undergo the timing verification by the timing verification section 11 (step ST1). The paths can include paths across the sequential circuit, paths across the input/output ports and paths between the sequential circuit and the input/output port. Subsequently, the initial power supply setting section 9 assigns the higher power supply potentials to the cells in the paths including a greater number of cells, and sets the initial power supply potentials of the cells at the assigned power supply potentials (step ST12). Afterward, when the timing verification detects a cell having a timing problem, the power supply modification section 13 specifies the change of the power supply potential of the cell such that the power supply potential of the cell whose delay time must be reduced is increased, and the power supply potential of the cell whose delay time must be increased is reduced.

As described above, the present embodiment 5 assigns the higher power supply potentials to the cells in descending order of the number of cells in the paths, and sets the initial power supply potentials of the cells at the assigned power supply potentials. Thus, the initial power supply potential of the cells whose delay time must be reduced becomes higher. Accordingly, it can reduce the change of the power supply potential of the cells, offering an advantage of being able to facilitate the efficient design of the semiconductor integrated circuit.

In addition, when the individual power supply potentials are delivered to nearly the same number of cells, the voltage drop of each power supply becomes nearly equal. Thus, it offers an advantage of being able to design the individual power supplies under equal conditions.

Embodiment 6

Figure 7:
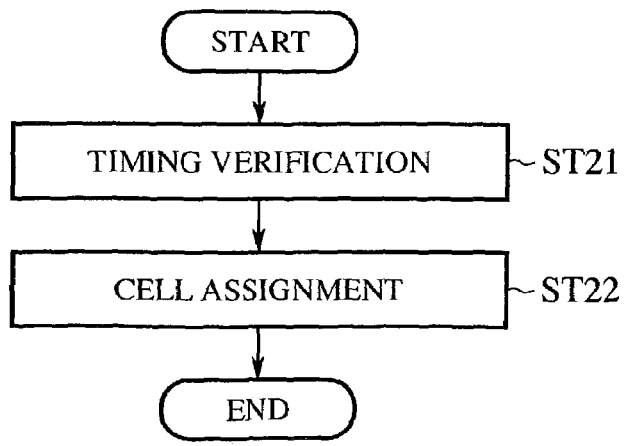
FIG. 7 is a flowchart illustrating an initial power supply setting method in the automatic placement and routing method of an embodiment 6 in accordance with the present invention.

FIG. 7 is a flowchart illustrating a procedure of the initial power supply setting method in the automatic placement and routing method of an embodiment 6 in accordance with the present invention.

In the present embodiment 6, the initial power supply setting section 9 reads the netlist 3 linked to the cells stored in the cell library 2. Then, the timing verification section 11 carries out the timing verification of the specified paths according to the netlist 3 (step ST21). It carries out the timing verification using estimated wire length model (information about the wire lengths and capacitance values depending on the number of fan-outs) described in the cell library 2. Subsequently, according to the result of the timing verification, the initial power supply setting section 9 assigns the higher power supply potentials to the cells whose delay time must be reduced beginning from the cells having a problem in the timing, and lower power supply potentials to the cells whose delay time must be increased. Then, it sets the initial power supply potentials of the cells at the assigned power supply potentials (step ST22). Afterward, when the timing verification detects a cell having a timing problem, the power supply modification section 13 specifies the change of the power supply potential of the cells such that the power supply potential of the cell whose delay time must be reduced is increased, and the power supply potential of the cell whose delay time must be increased is reduced.

As described above, according to the timing verification result, the present embodiment 6 assigns the higher power supply potentials to the cells whose delay time must be reduced beginning from the cells having a problem in the timing, and lower power supply potentials to the cells whose delay time must be increased; and sets the initial power supply potentials of the cells at the assigned power supply potentials. Thus, the initial power supply potentials of the cells whose delay time must be reduced become higher, and those of the cells whose delay times must be increased become lower. Accordingly, it can reduce the change of the power supply potential of the cells, offering an advantage of being able to facilitate the efficient design of the semiconductor integrated circuit.

In addition, when the individual power supply potentials are delivered to nearly the same number of cells, the voltage drop of each power supply becomes nearly equal. Thus, it offers an advantage of being able to design the individual power supplies under equal conditions.

Embodiment 7

Figure 8:
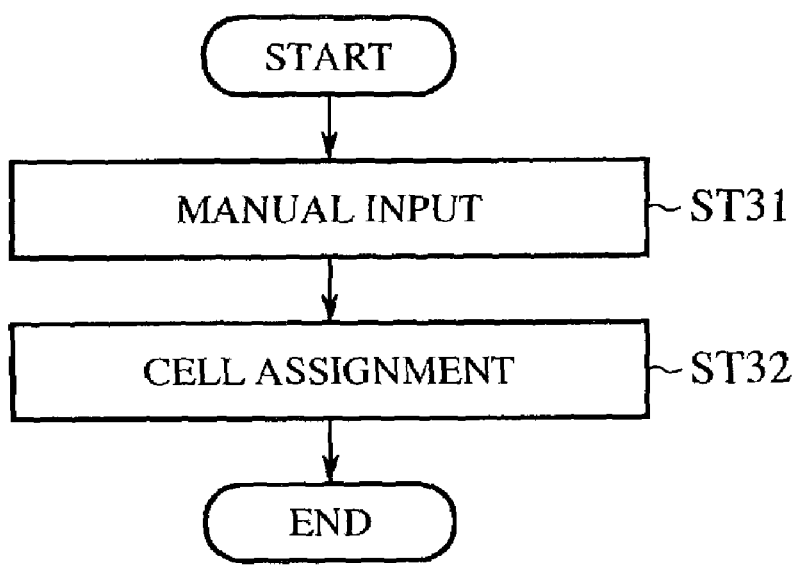
FIG. 8 is a flowchart illustrating an initial power supply setting method in the automatic placement and routing method of an embodiment 7 in accordance with the present invention.

FIG. 8 is a flowchart illustrating a procedure of the initial power supply setting method in the automatic placement and routing method of an embodiment 7 in accordance with the present invention.

In the present embodiment 7, a user inputs the values of the initial power supply potentials of the cells from the input section 6 (step ST31). Subsequently, according to the initial values of the power supply potentials of the cells the user input, the initial power supply setting section 9 sets the initial power supply potentials of the cells (step ST32). Afterward, when the timing verification detects a cell having a timing problem, the power supply modification section 13 specifies the change of the power supply potential of the cell such that the power supply potential of the cell whose delay time must be reduced is increased, and the power supply potential of the cell whose delay time must be increased is reduced.

As described above, the present embodiment 7 sets the initial power supply potentials of the cells according to the initial values of the power supply potentials of the cells the user inputs. Thus, it can increase the flexibility of selecting the initial power supply potentials of the cells. Consequently, it offers an advantage of being able to facilitate the design of various types of semiconductor integrated circuits.

Embodiment 8

Figure 9:
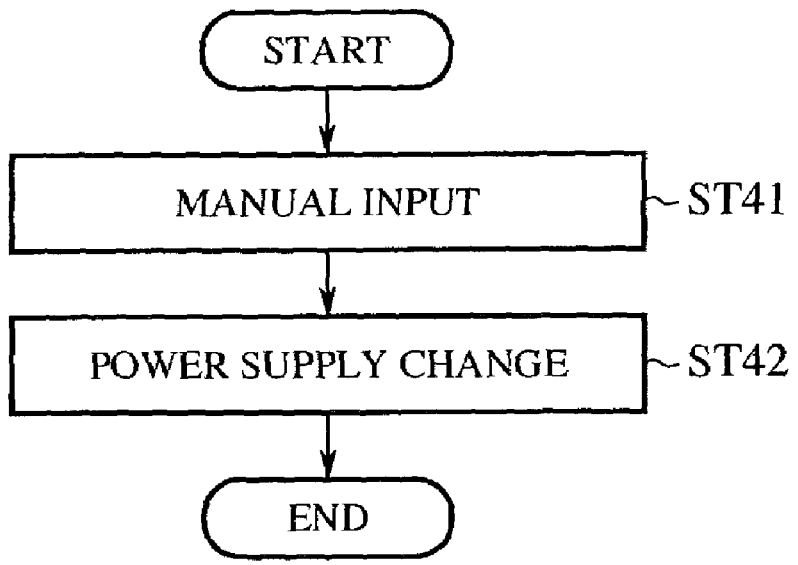
FIG. 9 is a flowchart illustrating a power supply modification method in the automatic placement and routing method of an embodiment 8 in accordance with the present invention.

FIG. 9 is a flowchart illustrating a procedure of the initial power supply setting method in the automatic placement and routing method of an embodiment 8 in accordance with the present invention.

In the present embodiment 8, when the timing verification detects a cell having a timing problem, a user inputs from the input section 6 the information about the change of the power supply potential of the cell such that the power supply potential of the cell whose delay time must be reduced is increased, and the power supply potential of the cell whose delay time must be increased is reduced (step ST41). Subsequently, the power supply modification section 13 specifies the change of the power supply potential of the cells according to the change of the power supply potential of the cells the user inputs.

As described above, the present embodiment 8 specifies the change of the initial power supply potential of the cells according to the information about the change of the power supply potential of the cells the user inputs. Thus, it can increase the flexibility of specifying the power supply potentials of the cells. Consequently, it offers an advantage of being able to facilitate the design of various types of semiconductor integrated circuits.

Embodiment 9

Figure 10:
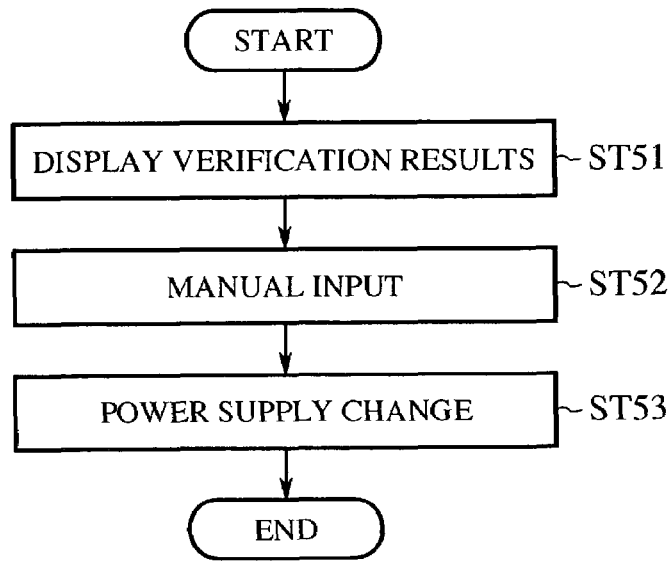
FIG. 10 is a flowchart illustrating a power supply modification method in the automatic placement and routing method of an embodiment 9 in accordance with the present invention.

FIG. 10 is a flowchart illustrating a procedure of the initial power supply setting method in the automatic placement and routing method of an embodiment 9 in accordance with the present invention.

In the present embodiment 9, the display section 7 displays the timing verification result (step ST51). For example, the display section 7 displays a cell having a timing problem such as a cell whose delay time must be reduced or increased. When the timing verification detects a cell having a timing problem, according to the timing verification result displayed on the display section 7, a user inputs from the input section 6 the information about the change of the power supply potential of the cell such that the power supply potential of the cell whose delay time must be reduced is increased, and the power supply potential of the cell whose delay time must be increased is reduced (step ST52). Subsequently, the power supply modification section 13 specifies the change of the power supply potential of the cells according to the information about the change of the power supply potential of the cells the user inputs (step ST53).

As described above, the present embodiment 9 displays the timing verification result on the display section 7. Accordingly, it offers an advantage of enabling the user to efficiently input the information about the change of the power supply potential of the cell according to the timing verification result displayed on the display section 7.

Embodiment 10

Figure 11:
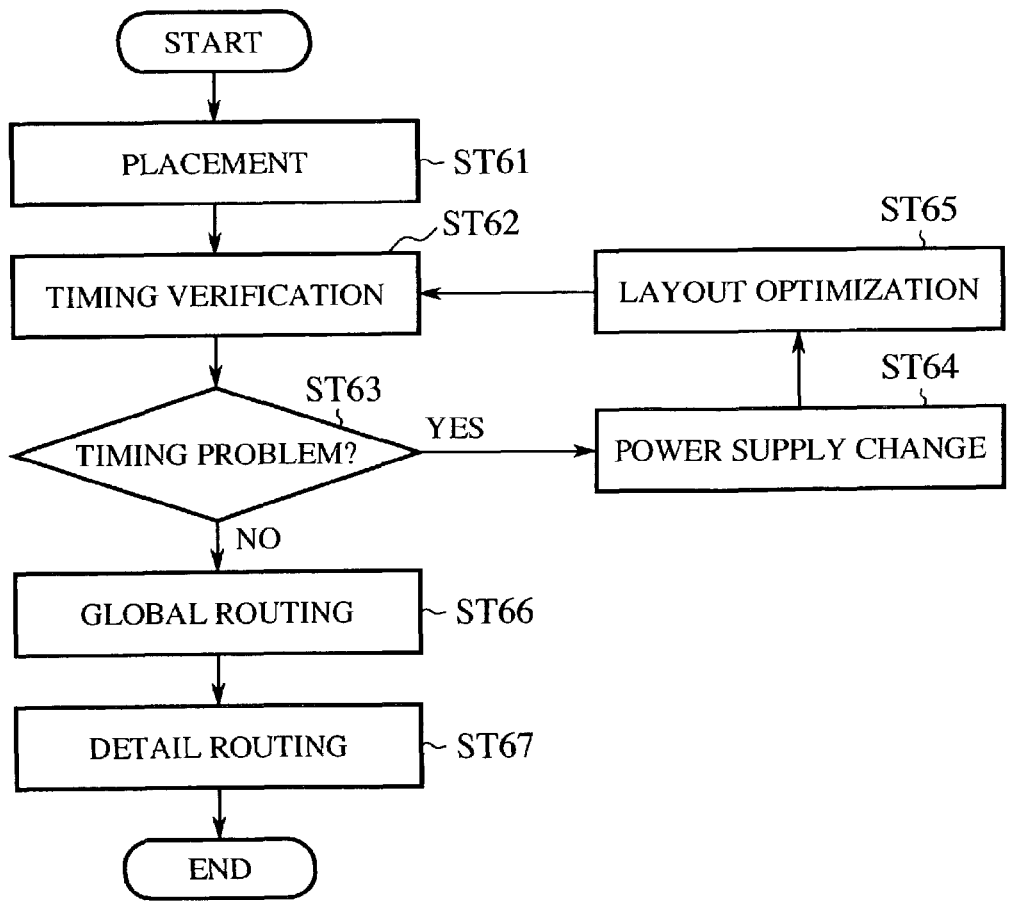
FIG. 11 is a flowchart illustrating placement and routing process, timing verification process, power supply change process and layout optimization process in the automatic placement and routing method in an embodiment 10 in accordance with the present invention.

FIG. 11 is a flowchart illustrating placement and routing process, timing verification process, power supply change process and layout optimization process in the automatic placement and routing method in an embodiment 10 in accordance with the present invention.

In the present embodiment 10, the placement and routing section 10 reads the netlist 3 linked to the cells stored in the cell library 2, the initial power supply potentials of the cells linked with the netlist 3 and the timing constraint information 4 about the semiconductor integrated circuit. Then, the placement and routing section 10 carries out the placement of the cells stored in the cell library 2 in accordance with the netlist 3 and the timing constraint information 4 which are read (step ST61).

Subsequently, the timing verification section 11 reads the layout information after the placement by the placement and routing section 10, and carries out the timing verification of the specified paths in accordance with the layout information (step ST62).

Subsequently, when the timing verification detects a cell having a timing problem at step ST63, the power supply modification section 13 specifies the change of the power supply potential of the cell such that the power supply potential of the cell whose delay time must be reduced is increased, and the power supply potential of the cell whose delay time must be increased is reduced (step ST64).

Subsequently, the placement and routing section 10 reads the information about the change of the power supply potential of the cell specified by the power supply modification section 13, and carries out the replacement of the cells in the altered portion in accordance with the information about the change of the power supply potential, thereby optimizing the layout (step ST65).

Subsequently, the timing verification section 11 reads the optimized layout information, and carries out the timing verification of the specified paths in accordance with the layout information (step ST62).

When the timing verification detects no cells having a timing problem at step ST63, the placement and routing section 10 carries out the global routing according to the netlist 3 and the timing constraint information 4 (step ST66), followed by the detail routing (step ST67), and by completing a series of the process.

In this way, it is possible to specify the power supply potential of the cells after the cell placement to fulfill the timing constraint of the semiconductor integrated circuit.

Embodiment 11

Figure 12:
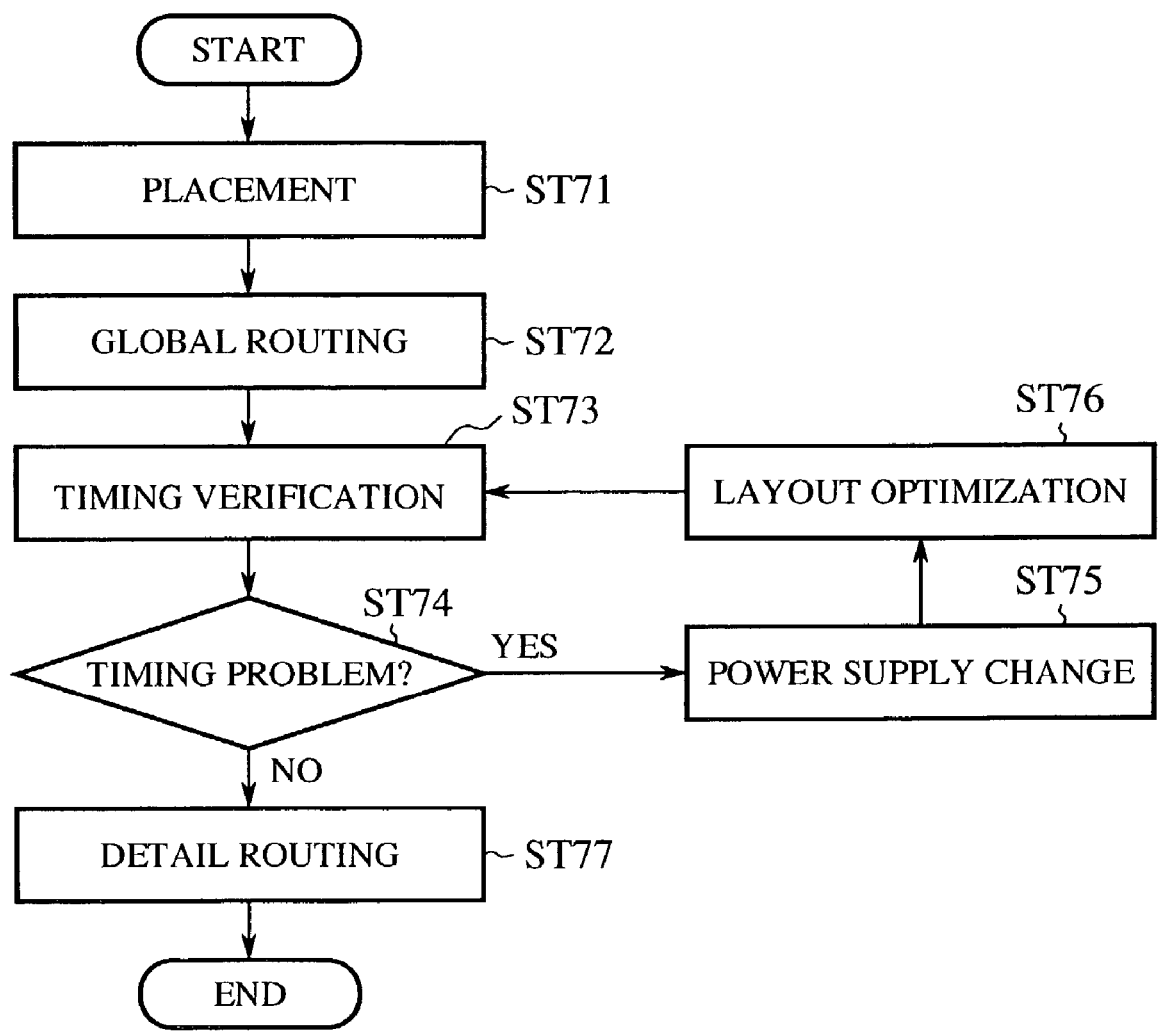
FIG. 12 is a flowchart illustrating placement and routing process, timing verification process, power supply change process and layout optimization process in the automatic placement and routing method in an embodiment 11 in accordance with the present invention.

FIG. 12 is a flowchart illustrating placement and routing process, timing verification process, power supply change process and layout optimization process in the automatic placement and routing method in an embodiment 11 in accordance with the present invention.

In the present embodiment 11, the placement and routing section 10 reads the netlist 3 linked to the cells stored in the cell library 2, the initial power supply potentials of the cells linked with the netlist 3 and the timing constraint information 4 about the semiconductor integrated circuit. Then, according to the netlist 3 and the timing constraint information 4 which are read out, the placement and routing section 10 carries out the placement of the cells stored in the cell library 2 (step ST71), followed by global routing (step ST72).

Subsequently, the timing verification section 11 reads the layout information after the global routing by the placement and routing section 10, and carries out the timing verification of the specified paths in accordance with the layout information (step ST73).

Subsequently, when the timing verification detects a cell having a timing problem at step ST74, the power supply modification section 13 specifies the change of the power supply potential of the cell such that the power supply potential of the cell whose delay time must be reduced is increased, and the power supply potential of the cell whose delay time must be increased is reduced (step ST75).

Subsequently, the placement and routing section 10 reads the information about the change of the power supply potential of the cell specified by the power supply modification section 13, and carries out the replacement and global rerouting of the cells in the altered portion in accordance with the information about the change of the power supply potential, thereby optimizing the layout (step ST76).

Subsequently, the timing verification section 11 reads the optimized layout information, and carries out the timing verification of the specified paths in accordance with the layout information (step ST73).

When the timing verification detects no cells having a timing problem at step ST74, the placement and routing section 10 carries out the detail routing of the replaced cells, according to the netlist 3 and the timing constraint information 4 (step ST77), thereby completing a series of the process.

In this way, it is possible to specify the power supply potential of the cell after the global routing to fulfill the timing constraint of the semiconductor integrated circuit. The present embodiment 11 can specify the power supply potential of the cell according to the timing verification result based on more detailed information than that of the foregoing embodiment 10.

Embodiment 12

Figure 13:
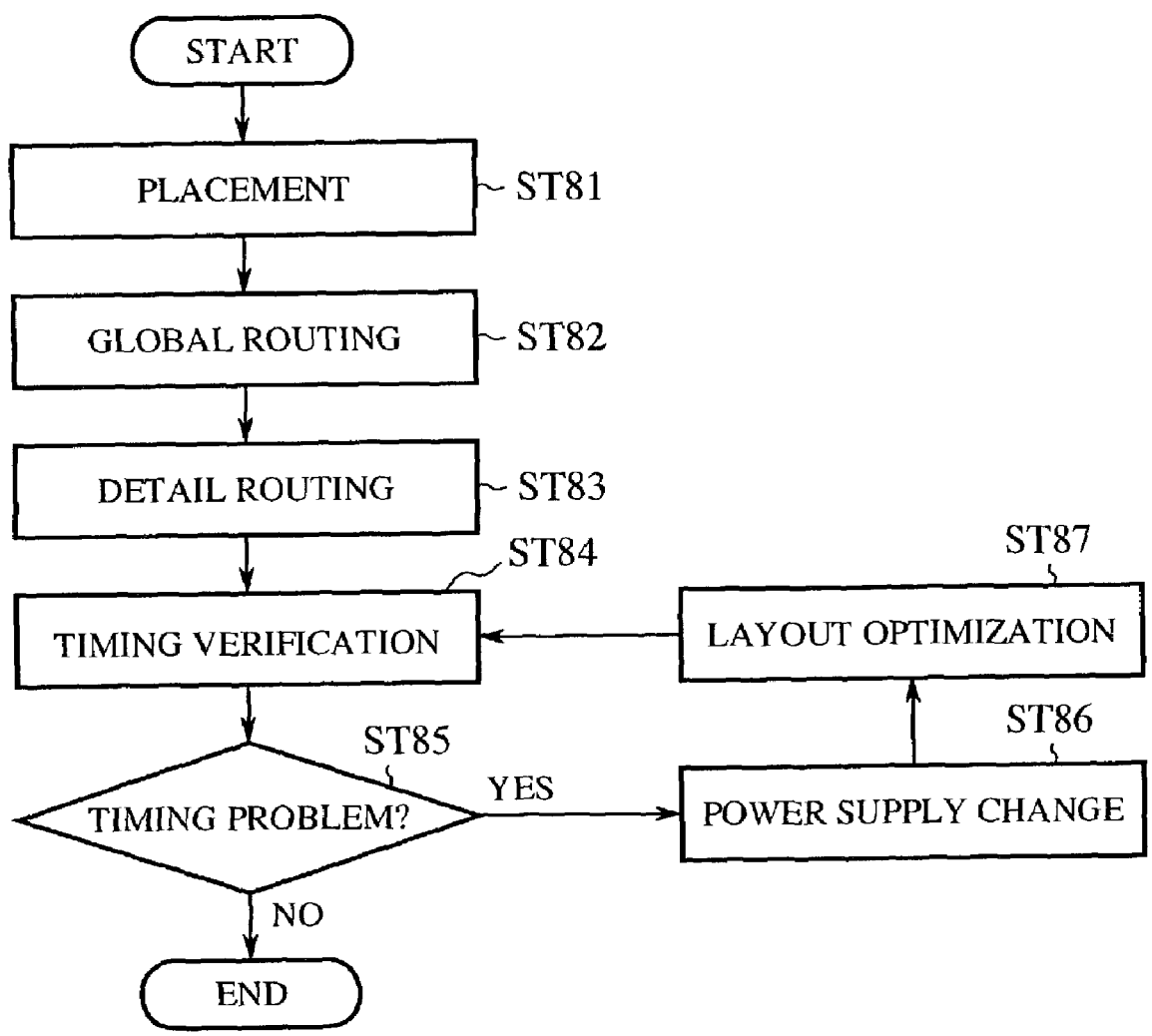
FIG. 13 is a flowchart illustrating placement and routing process, timing verification process, power supply change process and layout optimization process in the automatic placement and routing method in an embodiment 12 in accordance with the present invention.

FIG. 13 is a flowchart illustrating placement and routing process, timing verification process, power supply change process and layout optimization process in the automatic placement and routing method in an embodiment 12 in accordance with the present invention.

In the present embodiment 12, the placement and routing section 10 reads the netlist 3 linked to the cells stored in the cell library 2, the initial power supply potentials of the cells linked with the netlist 3 and the timing constraint information 4 about the semiconductor integrated circuit. Then, according to the netlist 3 and the timing constraint information 4 which are read out, the placement and routing section 10 carries out the placement of the cells stored in the cell library 2 (step ST81), followed by global routing (step ST82), and detail routing (step ST83).

Subsequently, the timing verification section 11 reads the layout information after the detail routing by the placement and routing section 10, and carries out the timing verification of the specified paths in accordance with the layout information (step ST84).

Subsequently, when the timing verification detects a cell having a timing problem at step ST85, the power supply modification section 13 specifies the change of the power supply potential of the cell such that the power supply potential of the cell whose delay time must be reduced is increased, and the power supply potential of the cell whose delay time must be increased is reduced (step ST86).

Subsequently, the placement and routing section 10 reads the information about the change of the power supply potential of the cell specified by the power supply modification section 13, and carries out the replacement, global rerouting and detail rerouting of the cell in the altered portion in accordance with the information about the change of the power supply potential, thereby optimizing the layout (step ST87).

Subsequently, the timing verification section 11 reads the optimized layout information, and carries out the timing verification of the specified paths in accordance with the layout information (step ST84).

When the timing verification detects no cells having a timing problem at step ST85, the series of the process is completed.

In this way, it is possible to specify the power supply potential of the cell after the detail routing to fulfill the timing constraint of the semiconductor integrated circuit. The present embodiment 12 can specify the power supply potential of the cell according to the timing verification result based on more detailed information than that of the foregoing embodiment 10 or 11.

Embodiment 13

Figure 14:
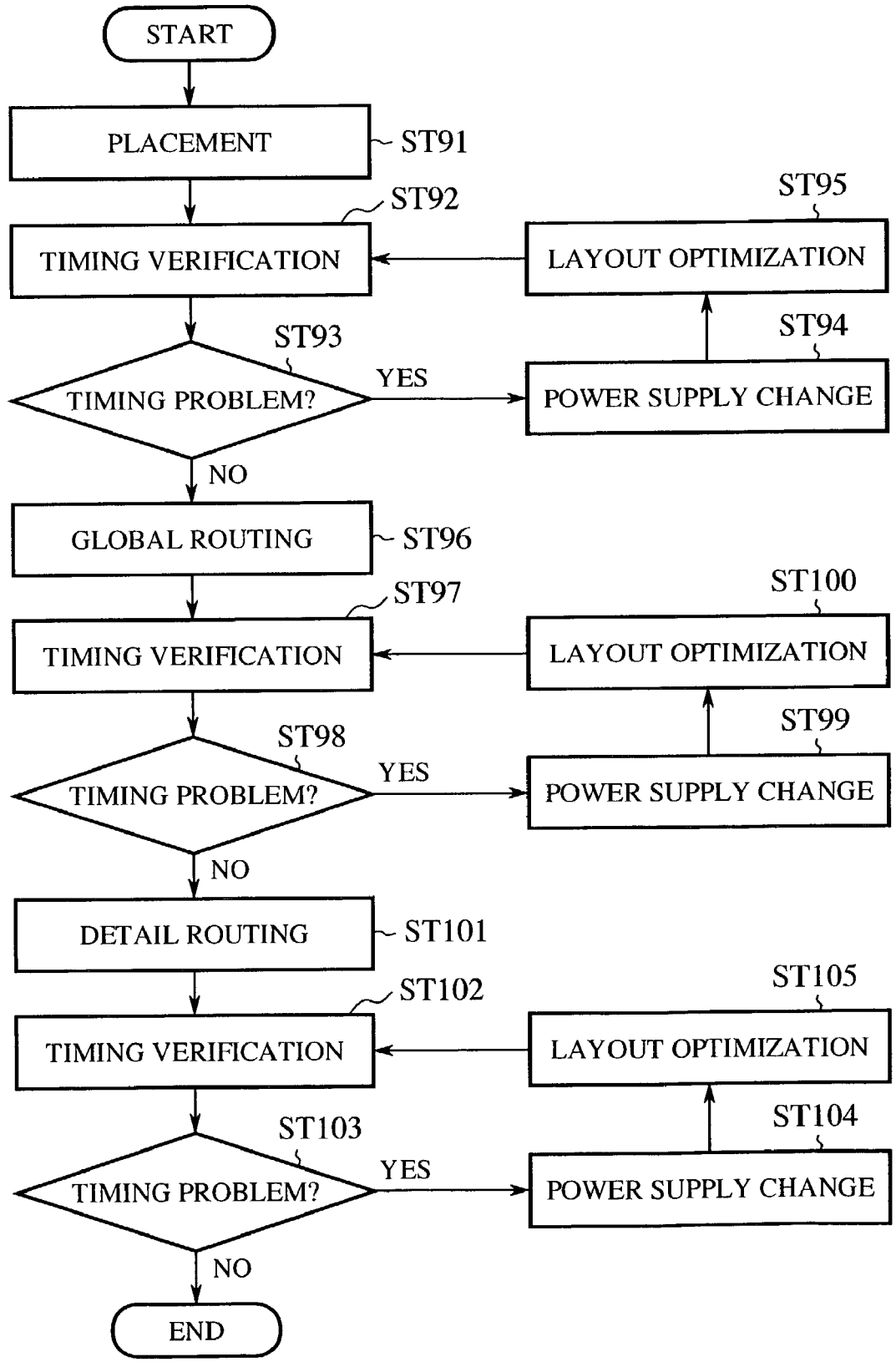
FIG. 14 is a flowchart illustrating placement and routing process, timing verification process, power supply change process and layout optimization process in the automatic placement and routing method in an embodiment 13 in accordance with the present invention.

FIG. 14 is a flowchart illustrating placement and routing process, timing verification process, power supply change process and layout optimization process in the automatic placement and routing method in an embodiment 13 in accordance with the present invention.

In the present embodiment 13, the placement and routing section 10 reads the netlist 3 linked to the cells stored in the cell library 2, the initial power supply potentials of the cells linked with the netlist 3 and the timing constraint information 4 about the semiconductor integrated circuit. Then, according to the netlist 3 and the timing constraint information 4 which are readout, the placement and routing section 10 carries out the placement of the cells stored in the cell library 2 (step ST91).

Subsequently, the timing verification section 11 reads the layout information after the cell placement by the placement and routing section 10, and carries out the timing verification of the specified paths in accordance with the layout information (step ST92).

Subsequently, when the timing verification detects a cell having a timing problem at step ST93, the power supply modification section 13 specifies the change of the power supply potential of the cell such that the power supply potential of the cell whose delay time must be reduced is increased, and the power supply potential of the cell whose delay time must be increased is reduced (step ST94).

Subsequently, the placement and routing section 10 reads the information about the change of the power supply potential of the cell specified by the power supply modification section 13, and carries out the replacement of the cell in the altered portion in accordance with the information about the change of the power supply potential, thereby optimizing the layout (step ST95).

Subsequently, the timing verification section 11 reads the optimized layout information, and carries out the timing verification of the specified paths in accordance with the layout information (step ST92).

When the timing verification detects no cells having a timing problem at step ST93, the placement and routing section 10 carries out the global routing according to the netlist 3 and the timing constraint information 4 (step ST96).

Subsequently, the timing verification section 11 reads the layout information after the global routing by the placement and routing section 10, and carries out the timing verification of the specified paths in accordance with the layout information (step ST97).

Subsequently, when the timing verification detects a cell having a timing problem at step ST98, the power supply modification section 13 specifies the change of the power supply potential of the cell such that the power supply potential of the cell whose delay time must be reduced is increased, and the power supply potential of the cell whose delay time must be increased is reduced (step ST99).

Subsequently, the placement and routing section 10 reads the information about the change of the power supply potential of the cell specified by the power supply modification section 13, and carries out the replacement and global rerouting of the cell in the altered portion in accordance with the information about the change of the power supply potential, thereby optimizing the layout (step ST100).

Subsequently, the timing verification section 11 reads the optimized layout information, and carries out the timing verification of the specified paths in accordance with the layout information (step ST97).

When the timing verification detects no cells having a timing problem at step ST98, the placement and routing section 10 carries out the detail routing according to the netlist 3 and the timing constraint information 4 (step ST101).

Subsequently, the timing verification section 11 reads the layout information after the detail routing by the placement and routing section 10, and carries out the timing verification of the specified paths in accordance with the layout information (step ST102).

Subsequently, when the timing verification detects a cell having a timing problem at step ST103, the power supply modification section 13 specifies the change of the power supply potential of the cell such that the power supply potential of the cell whose delay time must be reduced is increased, and the power supply potential of the cell whose delay time must be increased is reduced (step ST104).

Subsequently, the placement and routing section 10 reads the information about the change of the power supply potential of the cell specified by the power supply modification section 13, and carries out the replacement, global rerouting and detail rerouting of the cell in the altered portion in accordance with the information about the change of the power supply potential, thereby optimizing the layout (step ST105).

Subsequently, the timing verification section 11 reads the optimized layout information, and carries out the timing verification of the specified paths in accordance with the layout information (step ST102).

When the timing verification detects no cells having a timing problem at step ST103, the series of the process is completed.

In this way, it is possible to specify the power supply potential of the cells at respective stages after the cell placement, global routing and detail routing to fulfill the timing constraint of the semiconductor integrated circuit.

Embodiment 14

Figure 15:
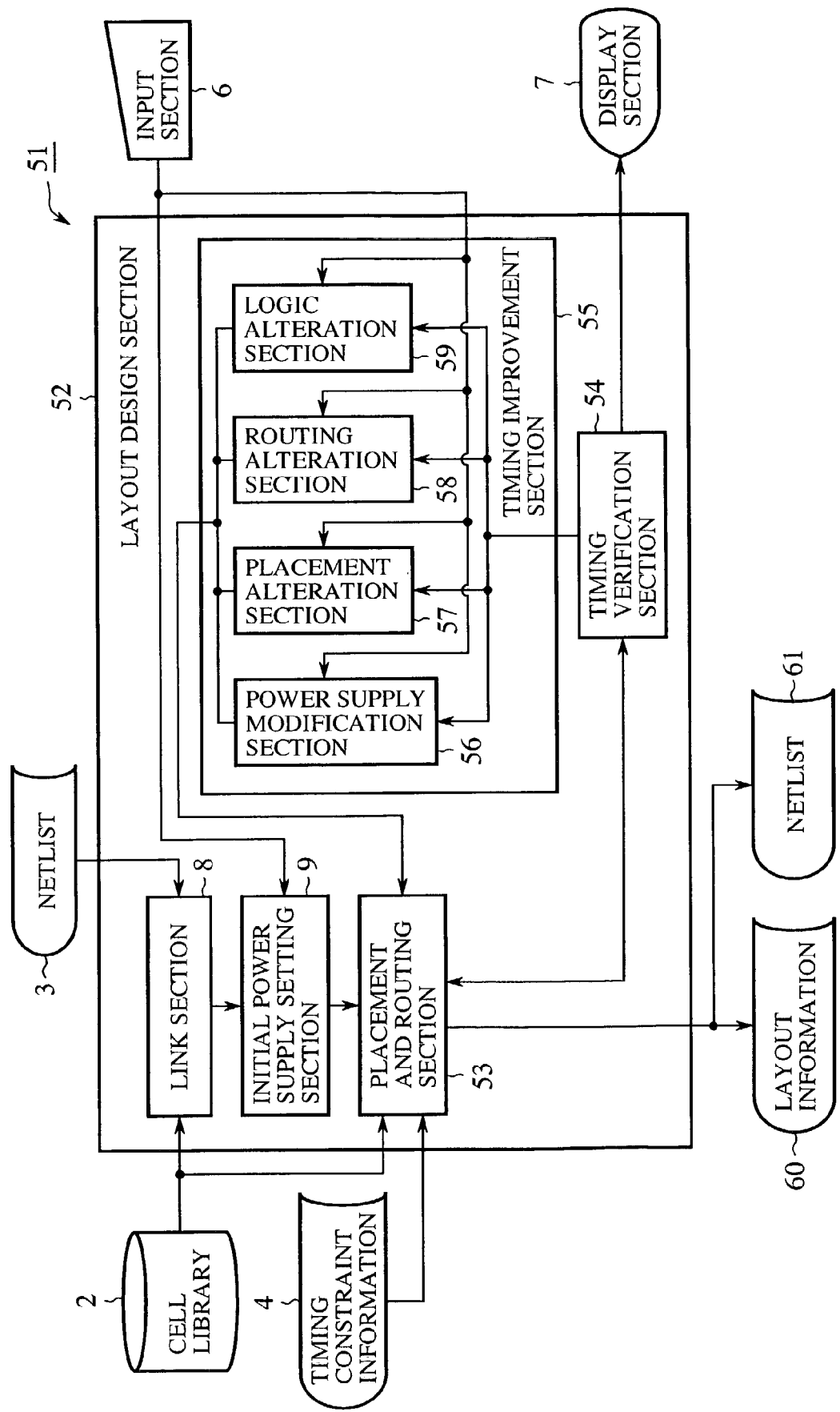
FIG. 15 is a block diagram showing a configuration of the automatic placement and routing apparatus of an embodiment 14 in accordance with the present invention.

FIG. 15 is a block diagram showing a configuration of the automatic placement and routing apparatus of an embodiment 14 in accordance with the present invention. In FIG. 15, the reference numeral 51 designates an automatic placement and routing apparatus that is used for the layout design of a semiconductor integrated circuit comprising a plurality of power supply systems with different potentials. The reference numeral 52 designates a layout design section for making a layout design of the semiconductor integrated circuit in conformity with the netlist 3 and timing constraint information 4 using the cells stored in the cell library 2.

In the layout design section 52, the reference numeral 53 designates a placement and routing section for carrying out the placement, global routing and detail routing of the cells stored in the cell library 2 according to the netlist 3 and timing constraint information 4. The reference numeral 54 designates a timing verification section for carrying out the timing verification of specified paths according to the layout information after the placement and routing by the placement and routing section 53. The reference numeral 55 designates a timing improvement section comprising a power supply modification section 56, a placement alteration section 57, a routing alteration section 58 and a logic alteration section 59. When the timing verification detects a cell having a timing problem, the power supply modification section 56 specifies the change of the power supply potential of that cell, the placement alteration section 57 alters the cell placement of that cell and its neighboring cells, the routing alteration section 58 specifies the alteration of the routing in the neighborhood of that cell, and the logic alteration section 59 specifies the alteration of the logic circuit in the neighborhood of that cell.

When the timing verification detects a cell having a timing problem, the placement and routing section 53 optimizes the layout according to the change of the power supply potential of the cell specified by the power supply modification section 56, to the alteration of the cell placement specified by the placement alteration section 57, to the alteration of the routing specified by the routing alteration section 58, and to the alteration of the logic circuit specified by the logic alteration section 59. On the other hand, when the timing verification detects no cells having a timing problem, the placement and routing section 53 outputs layout information 60 and a netlist 61.

The remaining components of FIG. 15 are the same as those of FIG. 1, which are designated by the same reference numerals.

Next, the operation of the present embodiment 14 will be described.

Figure 16:
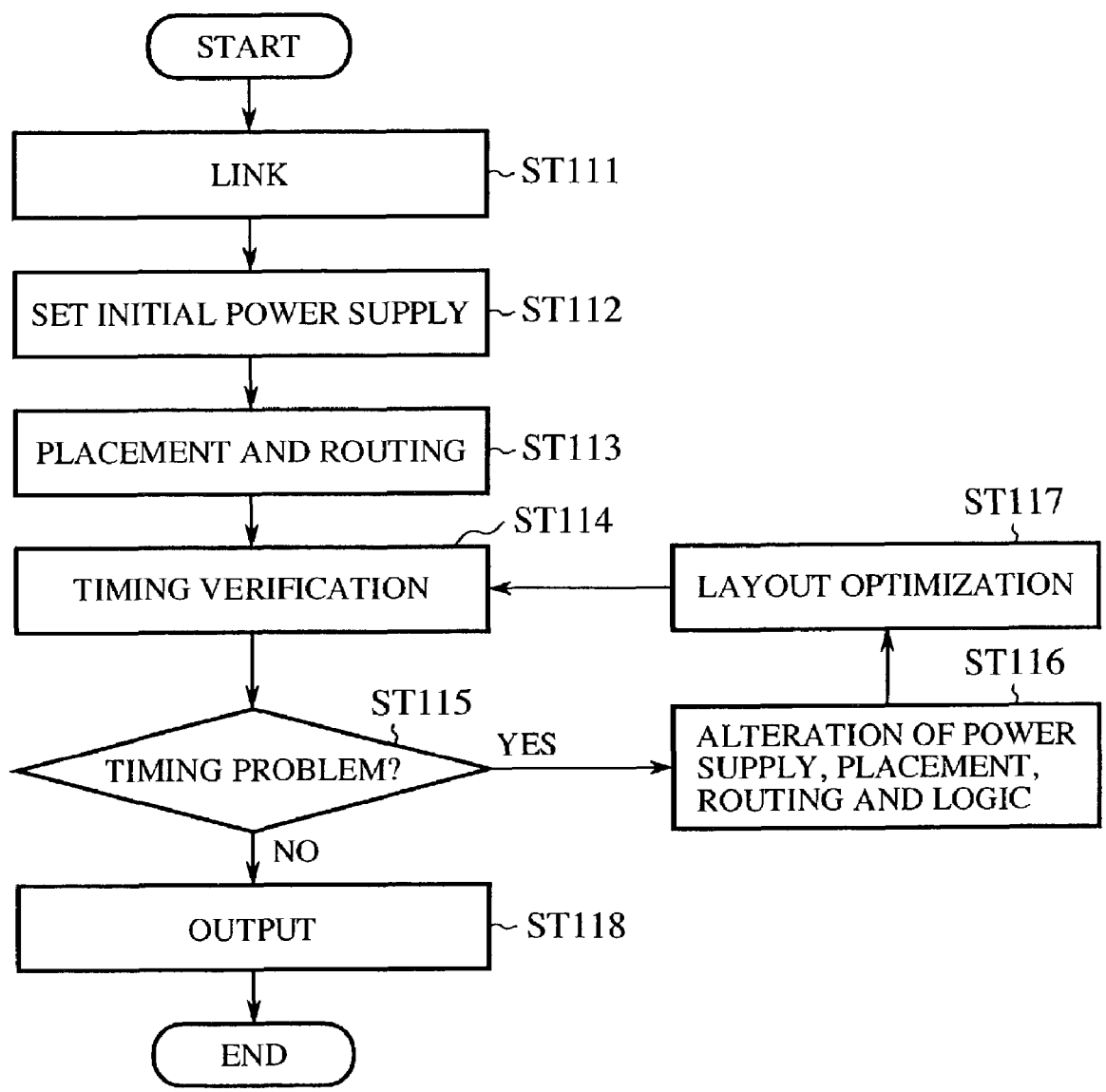
FIG. 16 is a flowchart illustrating a procedure of the automatic placement and routing method of the embodiment 14 in accordance with the present invention.
Figure 17:
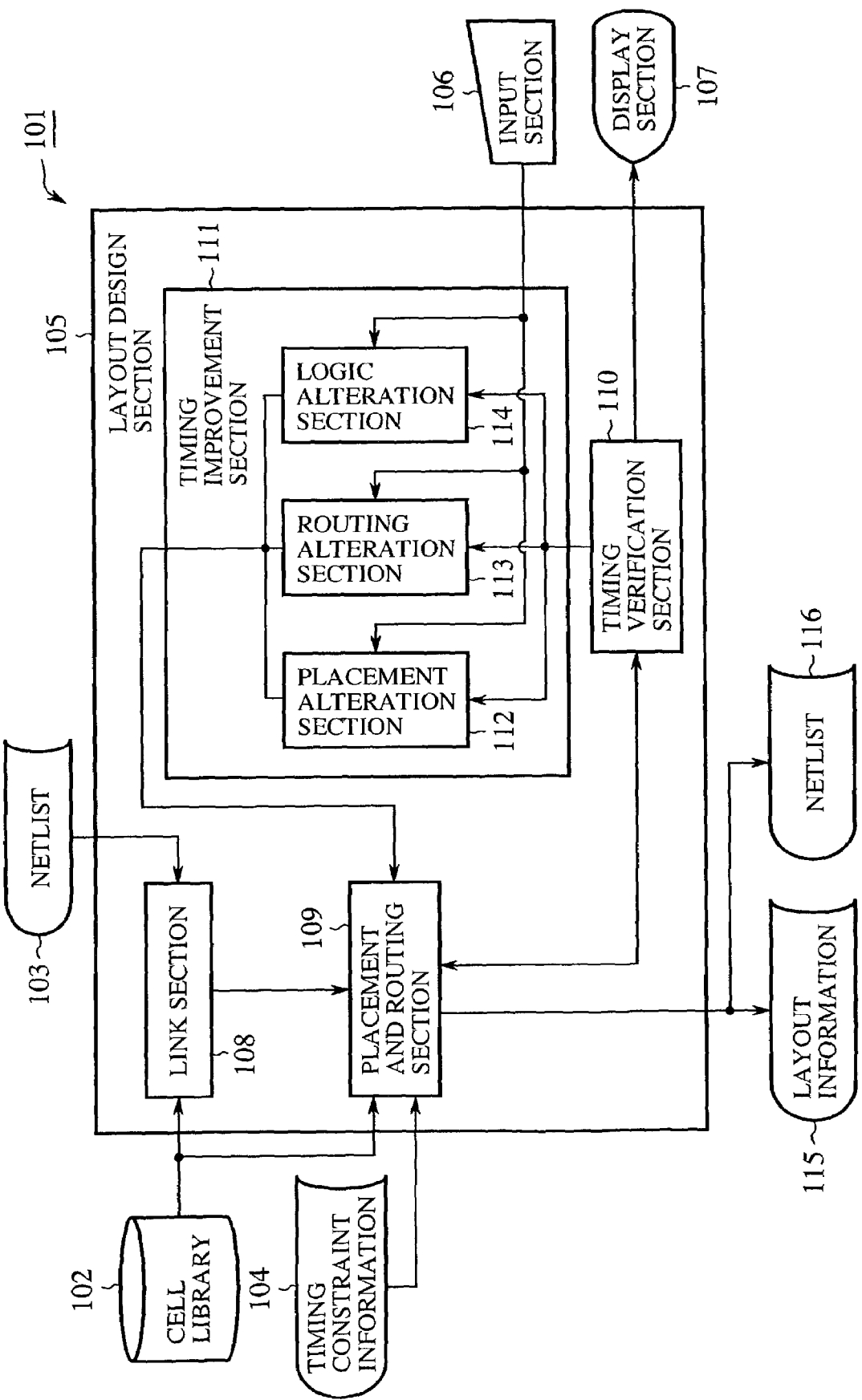
FIG. 17 is a block diagram showing a configuration of a conventional automatic placement and routing apparatus.
Figure 18:
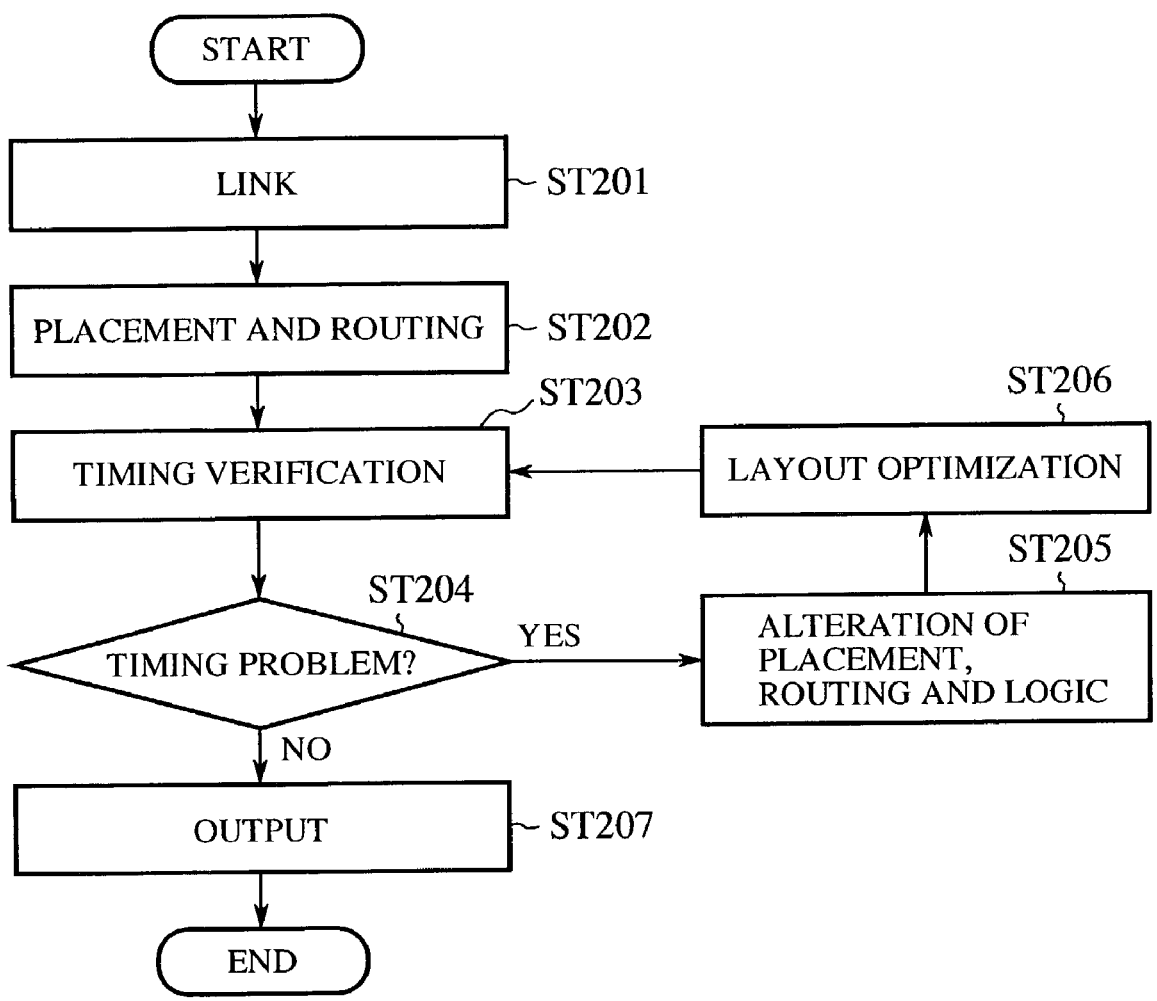
FIG. 18 is a flowchart illustrating a procedure of a conventional automatic placement and routing method.
Figure 19:
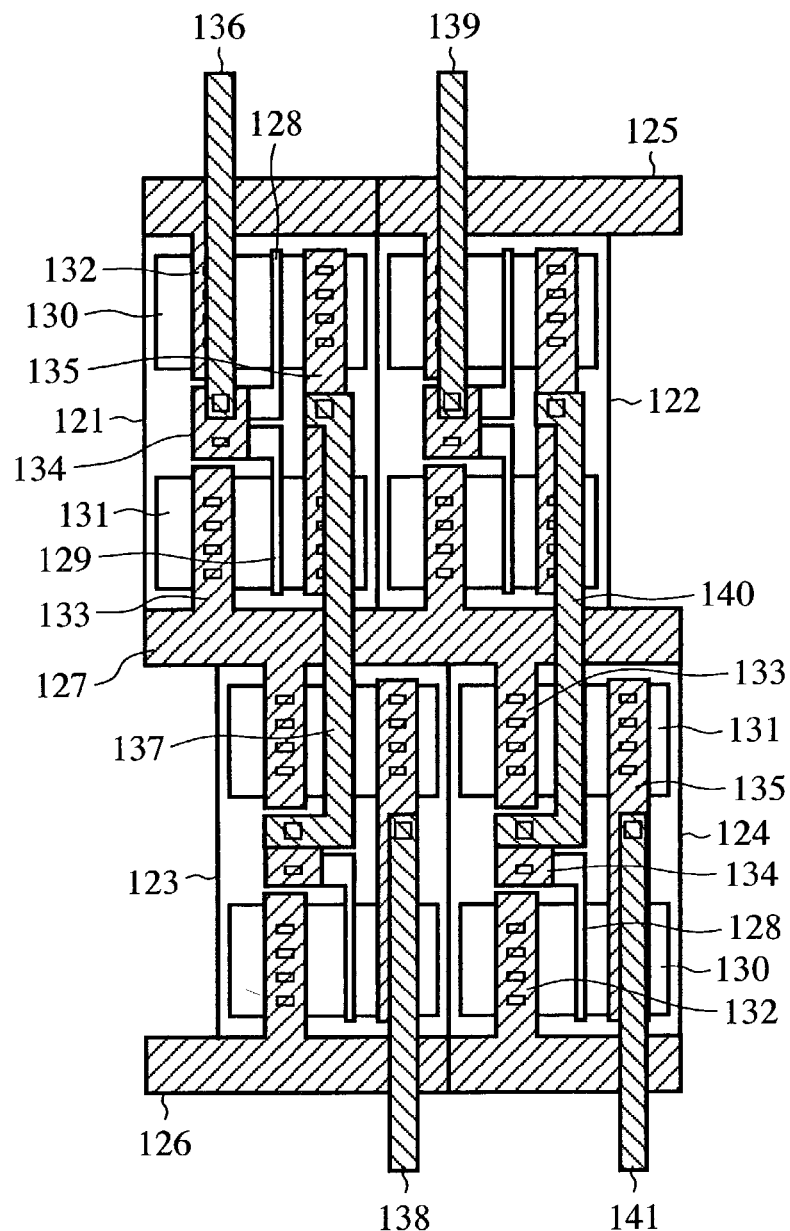
FIG. 19 is a layout diagram of a semiconductor integrated circuit completed by the conventional automatic placement and routing apparatus and automatic placement and routing method.
Figure 20:
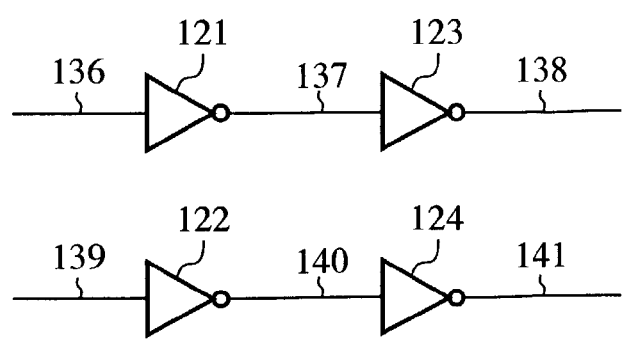
FIG. 20 is a diagram of a circuit fabricated in accordance with the layout of FIG. 19.

FIG. 16 is a flowchart illustrating a procedure of the automatic placement and routing method of the embodiment 14 in accordance with the present invention.

First, the link section 8 reads the netlist 3 that contains the logic connection information about the semiconductor integrated circuit, and links the netlist 3 to the cells stored in the cell library 2 (step ST111).

Subsequently, reading the netlist 3 linked to the cells stored in the cell library 2, the initial power supply setting section 9 sets the initial power supply potentials of the cells linked with the netlist 3 (step ST112).

Subsequently, the placement and routing section 53 reads the netlist 3 linked to the cells stored in the cell library 2, the initial power supply potentials of the cells linked with the netlist 3 and the timing constraint information 4 about the semiconductor integrated circuit, and carries out the placement, global routing and detail routing of the cells stored in the cell library 2 in accordance with the netlist 3 and the timing constraint information 4 (step ST113).

Subsequently, the timing verification section 54 reads the layout information after the placement and routing by the placement and routing section 53, and carries out the timing verification of the specified paths in accordance with the layout information (step ST114).

Subsequently, when the timing verification detects a cell having a timing problem at step ST115, the power supply modification section 56 specifies the change of the power supply potential of the cell having the timing problem, the placement alteration section 57 specifies the alteration of the placement of the cell having a timing problem and its neighboring cells, the routing alteration section 58 specifies the alteration of the routing in the neighborhood of the cell having a timing problem, and the logic alteration section 59 specifies the alteration of the logic circuit in the neighborhood of the cell having a timing problem (step ST116).

Subsequently, the placement and routing section 53 reads the information about the change of the power supply potential of the cell having the timing problem, which is specified by the power supply modification section 56, about the alteration of the cell placement specified by the placement alteration section 57, about the alteration of the routing specified by the routing alteration section 58, and about the alteration of the logic circuit specified by the logic alteration section 59. According to the information about the change of the power supply potential of the cell, that of the cell placement, that of the routing and that of the logic circuit, the placement and routing section 53 carries out the replacement and rerouting in the altered portion, thereby optimizing the layout (step ST117).

Subsequently, the timing verification section 54 reads the optimized layout information, and carries out the timing verification of the specified paths in accordance with the layout information (step ST114).

When the timing verification detects no cells having a timing problem at step ST115, the placement and routing section 53 outputs the layout information 60 and netlist 61 (step ST118).

The procedure from step ST114 to step ST117 is carried out until the timing verification detects no cells having the timing problem at step ST115, that is, until the timing constraint is satisfied.

In this way, it is possible to carry out the timing control of the semiconductor integrated circuit by using not only the change of the power supply potential of the cells, but also the alterations of the cell placement, routing and logic.

It is also possible to carry out the timing control of the semiconductor integrated circuit by using the change of the power supply potential of the cells, and the alterations of the-cell placement and routing without the alteration of the logic.

The initial power supply potentials of the cells can also be set using a method appropriate to each area among the methods of setting the initial power supply potentials of the cells of the foregoing embodiments 1 to 7.

The power supply potentials of the cells can also be varied by using a method appropriate to each area among the alteration methods of the power supply potentials of the foregoing embodiments 1, 8 and 9.

The automatic placement and routing apparatus and automatic placement and routing method described in the foregoing embodiments can also be implemented by incorporating an automatic placement and routing program into a computer.

What is claimed is:

1. An automatic placement and routing apparatus used for layout design of a semiconductor integrated circuit including a plurality of power supply systems with different potentials, said automatic placement and routing apparatus comprising:
   a cell library for storing cells; and
   a layout design section for carrying out the layout design of the semiconductor integrated circuit using the cells stored in said cell library, according to a netlist describing logic connection information about the semiconductor integrated circuit and timing constraint information about the semiconductor integrated circuit, wherein said layout design section comprises:
     a link section for linking the netlist to the cells stored in said cell library;
     an initial power supply setting section for setting initial power supply potentials of the cells linked with the netlist;
     a placement and routing section for carrying out placement, global routing and detail routing of the cells stored in said cell library according to the netlist and the timing constraint information;
     a timing verification section for carrying out timing verification of specified paths at a specified stage of the placement and routing by said placement and routing section according to layout information; and
     a power supply modification section for specifying, when the timing verification section detects a cell having a timing problem, change of the power supply potential of the cell, and
   wherein when the timing verification section detects the cell having a timing problem, according to the change of the power supply potential of the cell specified by said power supply modification section, said placement and routing section carries out replacement and rerouting of the cell in accordance with the change of power supply potential specified by said power supply modification section and optimizes the layout, and said timing verification section carries out the timing verification of the specified paths according to the optimized layout information.

2. The automatic placement and routing apparatus according to claim 1, wherein said initial power supply setting section sets the initial power supply potentials of all the cells at a same power supply potential.

3. The automatic placement and routing apparatus according to claim 2, wherein said initial power supply setting section sets the initial power supply potentials of all the cells at a lowest power supply potential.

4. The automatic placement and routing apparatus according to claim 2, wherein said initial power supply setting section sets the initial power supply potentials of all the cells at a highest power supply potential.

5. The automatic placement and routing apparatus according to claim 2, wherein when a number of said power supply systems is three or more, said initial power supply setting section sets the initial power supply potentials of all the cells at a power supply potential other than a lowest power supply potential and a highest power supply potential.

6. The automatic placement and routing apparatus according to claim 1, wherein said initial power supply setting section assigns a plurality of power supply potentials to the cells, and sets the initial power supply potentials of the cells at the power supply potentials assigned.

7. The automatic placement and routing apparatus according to claim 6, wherein said initial power supply setting section assigns nearly a same number of cells to the individual power supply potentials.

8. The automatic placement and routing apparatus according to claim 1, wherein said initial power supply setting section counts a number of cells in specified paths, assigns higher power supply potentials to the cells in the paths with a greater number of the cells, and sets the initial power supply potentials of the cells at the power supply potentials assigned.

9. The automatic placement and routing apparatus according to claim 1, wherein said initial power supply setting section carries out the timing verification of specified paths according to the netlist linked to the cells stored in said cell library, assigns power supply potentials according to the result of the timing verification such that a higher power supply potential is assigned to a path whose delay time must be reduced beginning from a cell having a timing problem, and a lower power supply potential to a path whose delay time must be increased, and sets the initial power supply potentials of the cells at the power supply potentials assigned.

10. The automatic placement and routing apparatus according to claim 1, wherein said layout design section comprises an input section for entering information necessary for the layout design, and wherein said initial power supply setting section sets the initial power supply potentials of the cells according to the information about the initial power supply potentials of the cells a user inputs via said input section.

11. The automatic placement and routing apparatus according to claim 1, wherein said layout design section comprises an input section for entering information necessary for the layout design, and wherein said power supply modification section specifies the change of the power supply potential of the cells according to the information about the change of the power supply potential of the cells a user inputs via said input section.

12. The automatic placement and routing apparatus according to claim 11, wherein said layout design section comprises a display section for displaying result of the timing verification.

13. The automatic placement and routing apparatus according to claim 1, wherein said timing verification section carries out the timing verification according to the layout information after the cell placement by said placement and routing section.

14. The automatic placement and routing apparatus according to claim 1, wherein said timing verification section carries out the timing verification according to the layout information after the global routing by said placement and routing section.

15. The automatic placement and routing apparatus according to claim 1, wherein said timing verification section carries out the timing verification according to the layout information after the detail routing by said placement and routing section.

16. The automatic placement and routing apparatus according to claim 1, wherein said timing verification section carries out the timing verification at each stage after the cell placement, global routing and detail routing by said placement and routing section according to the layout information at each stage.

* * * * *